United States Patent
Atungsiri

(10) Patent No.: US 9,967,125 B2
(45) Date of Patent: May 8, 2018

(54) RECEIVER AND METHOD OF RECEIVING

(71) Applicant: SONY CORPORATION, Tokyo (JP)

(72) Inventor: Samuel Asangbeng Atungsiri, Weybridge (GB)

(73) Assignee: Sony Corporation, Tokyo (JP)

(*) Notice: Subject to any disclaimer, the term of this patent is extended or adjusted under 35 U.S.C. 154(b) by 0 days. days.

(21) Appl. No.: 15/525,764

(22) PCT Filed: Nov. 12, 2015

(86) PCT No.: PCT/GB2015/053441
§ 371 (c)(1),
(2) Date: May 10, 2017

(87) PCT Pub. No.: WO2016/075476
PCT Pub. Date: May 19, 2016

(65) Prior Publication Data
US 2017/0338994 A1 Nov. 23, 2017

(30) Foreign Application Priority Data

Nov. 12, 2014 (GB) .................................... 1420117.2
Jul. 22, 2015 (GB) .................................... 1512955.4

(51) Int. Cl.
*H04L 27/26* (2006.01)
*H04L 5/00* (2006.01)
(Continued)

(52) U.S. Cl.
CPC .... *H04L 27/2666* (2013.01); *H03M 13/2707* (2013.01); *H04L 5/0007* (2013.01);
(Continued)

(58) Field of Classification Search
CPC . H04L 27/2666; H04L 5/0007; H04L 27/266; H04L 27/2695; H04L 27/1566;
(Continued)

(56) References Cited

U.S. PATENT DOCUMENTS

| 6,711,221 B1 * | 3/2004 | Belotserkovsky .. H04L 27/2662 375/343 |
| 7,613,104 B2 * | 11/2009 | Bhatt .................. H04L 27/2656 370/208 |

(Continued)

FOREIGN PATENT DOCUMENTS

| GB | 2512392 A | 10/2014 |
| GB | 2513839 A | 11/2014 |

(Continued)

OTHER PUBLICATIONS

Hyeong-Sook Park, et al., "Design of synchronization in OFDMA/TDD based Wibro system" The 18$^{th}$ Annual IEEE International Symposium on Personal, Indoor and Mobile Radio Communications (PIMRC'07), XP031168829, 2007, 5 Pages.

(Continued)

*Primary Examiner* — Freshteh N Aghdam
(74) *Attorney, Agent, or Firm* — Oblon, McClelland, Maier & Neustadt, L.L.P.

(57) ABSTRACT

A receiver detects a received signal, transmitted by a transmitter to carry payload data as Orthogonal Frequency Division Multiplexed (OFDM) symbols in divided frames, each frame including a preamble including plural bootstrap OFDM symbols. A detector circuit detects, from the bootstrap OFDM symbols, a synchronization timing for converting a useful part of the bootstrap OFDM symbols into the frequency domain. A bootstrap processor detects an estimate of the channel transfer function from a first OFDM symbol, and a demodulator circuit recovers the signaling data from the bootstrap OFDM symbols using the estimate. The bootstrap processor includes an up-sampler configured to receive the bootstrap OFDM symbols, to form an up-sampled frequency domain version of the bootstrap OFDM symbol, and an output processor configured to identify a peak correlation (Continued)

result, to determine frequency offset of the received signal from a relative position of the peak correlation result in the frequency domain.

18 Claims, 24 Drawing Sheets

(51) Int. Cl.
    *H03M 13/27*      (2006.01)
    *H04W 56/00*      (2009.01)
    *H04L 27/156*     (2006.01)
    *H04L 27/00*      (2006.01)

(52) U.S. Cl.
    CPC ........ *H04L 27/266* (2013.01); *H04L 27/2695* (2013.01); *H04L 27/1566* (2013.01); *H04L 27/2657* (2013.01); *H04L 2027/0065* (2013.01); *H04W 56/004* (2013.01)

(58) Field of Classification Search
    CPC ........ H04L 27/2657; H04L 2027/0065; H03M 13/2707; H04W 56/004
    See application file for complete search history.

(56) References Cited

U.S. PATENT DOCUMENTS

| | | | |
|---|---|---|---|
| 2003/0112743 A1* | 6/2003 | You | H04L 27/2663 370/203 |
| 2007/0280098 A1 | 12/2007 | Bhatt et al. | |
| 2008/0186948 A1* | 8/2008 | Ramaswamy | H04L 27/2656 370/350 |
| 2009/0147900 A1* | 6/2009 | Lee | H04L 27/2662 375/362 |
| 2015/0103965 A1* | 4/2015 | Chari | H04L 27/2657 375/371 |

FOREIGN PATENT DOCUMENTS

| | | |
|---|---|---|
| WO | WO 2007/138453 A2 | 12/2007 |
| WO | WO 2007/138453 A3 | 12/2007 |

OTHER PUBLICATIONS

ETSI, "Digital Video Broadcasting (DVB); Implementation guidelines for a second generation digital terrestrial television broadcasting system (DVB-T2)" ETSI TS 102 831 V1.2.1, XP002754875, Aug. 2012, 19 Pages.

"ATSC Candidate Standard: System Discovery and Signaling (Doc. A/321 Part 1)" Advanced Television Systems Committee, May 6, 2015, 20 Pages.

* cited by examiner

RECEIVER AND METHOD OF RECEIVING

FIELD OF THE DISCLOSURE

The present disclosure relates to receivers and methods of receiving payload data using Orthogonal Frequency Division Multiplexed (OFDM) symbols.

BACKGROUND OF THE DISCLOSURE

The present disclosure claims the Paris convention priority of UK 1420117.2 filed on 12 Nov. 2014, the entire contents of which are incorporated herein by reference.

There are many examples of radio communications systems in which data is communicated using Orthogonal Frequency Division Multiplexing (OFDM). Television systems which have been arranged to operate in accordance with Digital Video Broadcasting (DVB) standards for example, use OFDM for terrestrial and cable transmissions. OFDM can be generally described as providing K narrow band sub-carriers (where K is an integer) which are modulated in parallel, each sub-carrier communicating a modulated data symbol such as for example Quadrature Amplitude Modulated (QAM) symbol or Quaternary Phase-shift Keying (QPSK) symbol. The modulation of the sub-carriers is formed in the frequency domain and transformed into the time domain for transmission. Since the data symbols are communicated in parallel on the sub-carriers, the same modulated symbols may be communicated on each sub-carrier for an extended period. The sub-carriers are modulated in parallel contemporaneously, so that in combination the modulated carriers form an OFDM symbol. The OFDM symbol therefore comprises a plurality of sub-carriers each of which has been modulated contemporaneously with different modulation symbols. During transmission, a guard interval filled by a cyclic prefix of the OFDM symbol precedes each OFDM symbol. When present, the guard interval is dimensioned to absorb any echoes of the transmitted signal that may arise from multipath propagation.

It has been proposed for a television system known as the Advanced Television Systems Committee (ATSC) 3.0 in a publication entitled ATSC 3.0 Working Draft System Discovery and Signaling [1] to include a pre-amble in a transmitted television signal which is carrying broadcast digital television programmes. The preamble includes a so called "boots strap" signal which is intended to provide a receiver with a part of the transmitted signal which it can have a greater likelihood of detecting and therefore can serve as a signal for initial detection. This is because broadcasters anticipate providing multiple services, within a broadcast signal in addition to just broadcast television. Such services may be time-multiplexed together within a single RF channel. There is therefore a need to provide an easily detectable signal segment (the bootstrap signal) that is transmitted as part of a pre-amble to multiplexed frames, so that a receiver can discover and identify what signals and services are available.

It has been proposed [1] to make the bootstrap signal have a fixed configuration, including sampling rate, signal bandwidth, subcarrier spacing, time-domain structure etc known to all receiver devices and to carry information to enable processing and decoding the wireless service associated with a detected bootstrap. This new capability ensures that broadcast spectrum can be adapted to carry new services and/or waveforms that are preceded by a universal entry point provided by the bootstrap for public interest to continue to be served in the future.

The bootstrap has been designed to be a very robust signal and detectable even at very low signal levels. As a result of this robust encoding, individual signalling bits within the bootstrap are comparatively expensive in terms of the physical resources that they occupy for transmission. Hence, the bootstrap is generally intended to signal only the minimum amount of information required for system discovery and for initial decoding of the following signal.

As can be appreciated, finding an efficient and cost effective technique for detecting payload data carried by OFDM symbols using the bootstrap signal represents a technical problem.

SUMMARY OF THE DISCLOSURE

Various further aspects and embodiments of the disclosure are provided in the appended claims, including a receiver for detecting and recovering payload data from a received signal. The receiver includes a radio frequency demodulation circuit configured to detect a received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols. A detector circuit is configured to detect, from one or more of the bootstrap OFDM symbols, a synchronisation timing for converting a useful part of the bootstrap OFDM symbols into the frequency domain. A bootstrap processor is configured to detect, using the signature sequence, a frequency offset of the received signal and an estimate of the channel transfer function from a first of the bootstrap OFDM symbols, and a demodulator circuit is configured to recover the signalling data from the one or more bootstrap OFDM symbols using the estimate of the channel transfer function. The bootstrap processor comprises an up-sampler configured to receive the bootstrap OFDM symbols, and to form an up-sampled frequency domain version of the bootstrap OFDM symbol, the up-sampled frequency domain version comprising for each sub-carrier of the first bootstrap OFDM symbol a plurality of U samples representing each of the sub-carriers of the bootstrap OFDM symbol, a cross-correlator configured to cross-correlate a signature sequence, which was combined with the first bootstrap OFDM symbol at the transmitter, with the up-sampled version of the first bootstrap OFDM symbol to generate for each of the sub-carriers of the up-sampled version of the OFDM symbol a correlation result, and an output processor configured to identify a peak correlation result generated by the cross-correlator, and to determine the frequency offset of the received signal from a relative position of the peak correlation result in the frequency domain in accordance with a sub-carrier bandwidth of the up-sampled version of the bootstrap OFDM symbol.

Embodiments of the present technique can provide an arrangement for improving an accuracy with which a frequency offset which is present in a received signal carrying payload data as OFDM symbols, can be estimated using a bootstrap signal. As indicated above, the bootstrap signal forms part of a preamble of each of a plurality of time divided frames in which the payload data is transmitted. The bootstrap signal comprises a plurality of OFDM symbols which may be configured with communications parameters such as a modulation scheme, coding rate, bandwidth and transmission power so that the bootstrap signal is more likely to be detectable than the payload data at the receiver.

Each of the bootstrap OFDM symbols carries a signature sequence, which is used to represent signalling information, such as layer 1 signalling. According to the present technique, a bootstrap processor for detecting the bootstrap OFDM symbols is configured to receive a frequency domain version of the first bootstrap OFDM symbol and to up-sample the first bootstrap OFDM symbol by a factor U. A cross-correlator in the bootstrap processor is then configured to perform a cross-correlation of the up-sampled bootstrap OFDM symbol with a re-generated version of the signature sequence to identify both an integer frequency offset with respect to a displacement in a number of sub-carriers from a reference frequency, which may have been introduced at the transmitter and a fine frequency offset caused by frequency shift introduced during transmission. By estimating the fine frequency offset with respect to a sample of the up-sampled version of the first bootstrap OFDM symbol, a more accurate estimate of the fine frequency offset can be determined.

The present disclosure is supported by our co-pending patent applications numbers PCT/GB2014/050869, GB1305805.2, PCT/GB2014/050868, GB1305797.1, GB1305799.7, Ser. No. 14/226,937, PCT/GB2014/050870, GB1305795.5, PCT/GB2014/050954, GB1312048.0, GB103121570, PCT/GB2014/051679, GB13170706.9, PCT/EP2014/061467, GB1403392.2, GB1405037.1, GB103121568 and PCT/GB2014/051922, GB1420117.2 the entire contents of which are incorporated herein by reference.

Various further aspects and features of the present disclosure are defined in the appended claims, which include a method of transmitting payload data, a receiver and a method of detecting and recovering payload data.

BRIEF DESCRIPTION OF THE DRAWINGS

Embodiments of the present disclosure will now be described by way of example only with reference to the accompanying drawings in which like parts are provided with corresponding reference numerals and in which FIG. 1 provides a schematic diagram illustrating an arrangement of a broadcast transmission network.

DETAILED DESCRIPTION OF EXAMPLE EMBODIMENTS

Embodiments of the present disclosure can be arranged to form a transmission network for transmitting signals representing data including video data and audio data so that the transmission network can, for example, form a broadcast network for transmitting television signals to television receiving devices. In some examples the devices for receiving the audio/video of the television signals may be mobile devices in which the television signals are received while on the move. In other examples the audio/video data may be received by conventional television receivers which may be stationary and may be connected to a fixed antenna or antennas.

Television receivers may or may not include an integrated display for television images and may be recorder devices including multiple tuners and demodulators. The antenna(s) may be inbuilt to television receiver devices. The connected or inbuilt antenna(s) may be used to facilitate reception of different signals as well as television signals. Embodiments of the present disclosure are therefore configured to facilitate the reception of audio/video data representing television programs to different types of devices in different environments.

As will be appreciated, receiving television signals with a mobile device while on the move may be more difficult because radio reception conditions will be considerably different to those of a conventional television receiver whose input comes from a fixed antenna.

Figure 1:
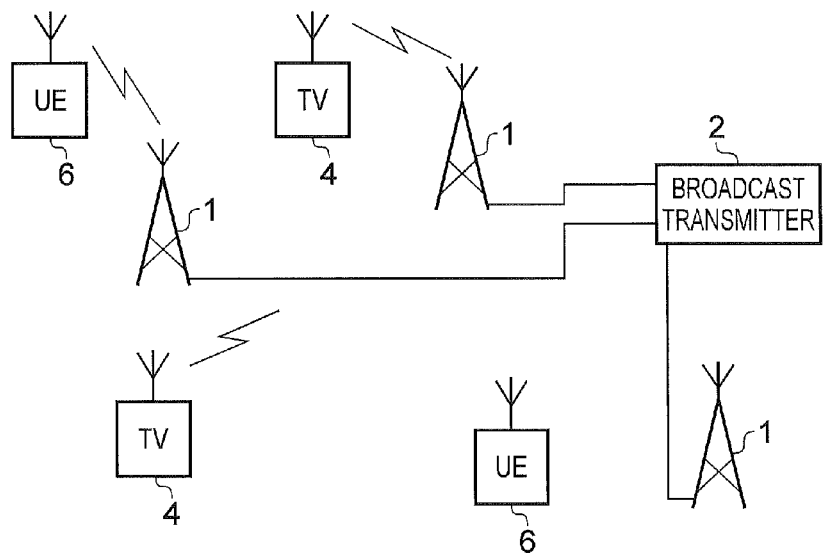

An example illustration of a television broadcast system is shown in FIG. 1. In FIG. 1 broadcast television base stations 1 are shown to be connected to a broadcast transmitter 2. The broadcast transmitter 2 transmits signals from base stations 1 within the coverage area of the broadcast network. The television broadcast network shown in FIG. 1 may operate as a so called multi-frequency network where each television broadcast base station 1 transmits its signal on a different frequency than other neighbouring television broadcast base stations 1. The television broadcast network shown in FIG. 1 may also operate as a so called single frequency network in which each of the television broadcast base stations 1 transmit the radio signals conveying audio/video data contemporaneously so that these can be received by television receivers 4 as well as mobile devices 6 within the coverage area of the broadcast network. For the example shown in FIG. 1 the signals transmitted by the broadcast base stations 1 are transmitted using Orthogonal Frequency Division Multiplexing (OFDM) which can provide an arrangement for transmitting the same signals from each of the broadcast stations 2 which can be combined by a television receiver even if these signals are transmitted from different base stations 1. Provided a spacing of the broadcast base stations 1 is such that the propagation time between the signals transmitted by different broadcast base stations 1 is less than or does not substantially exceed a guard interval that precedes the transmission of each of the OFDM symbols then a receiver device 4, 6 can receive the OFDM symbols and recover data from the OFDM symbols in a way which combines the signals transmitted from the different broadcast base stations 1. Examples of standards for broadcast networks that employ OFDM in this way include DVB-T, DVB-T2 and ISDB-T.

Figure 2:
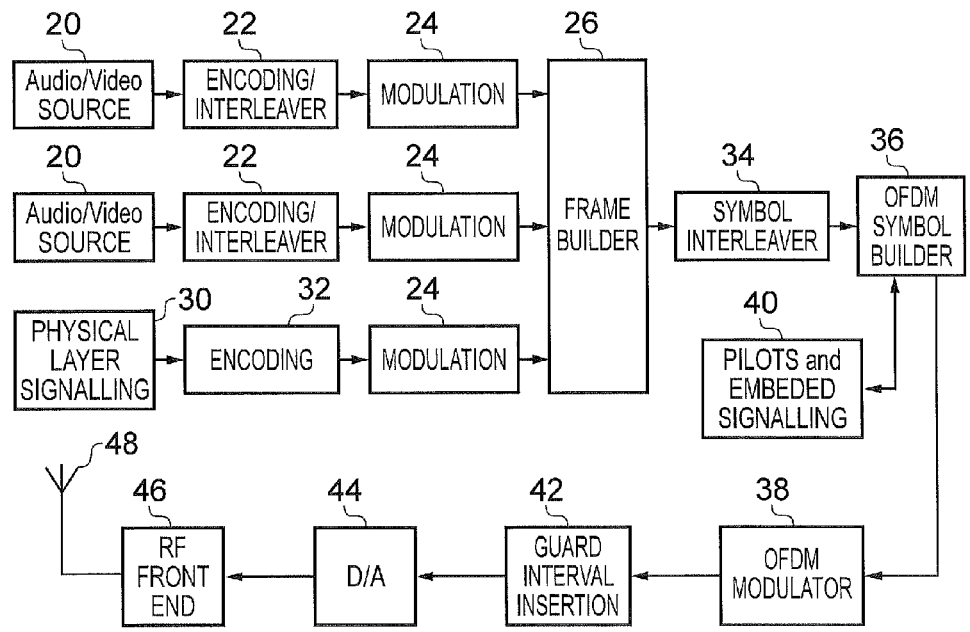
FIG. 2 provides a schematic block diagram illustrating an example transmission chain for transmitting broadcast data via the transmission network of FIG. 1.

An example block diagram of a transmitter forming part of the television broadcast base stations 1 for transmitting data from audio/video sources is shown in FIG. 2. In FIG. 2 audio/video sources 20 generate the audio/video data representing television programmes. The audio/video data is encoded using forward error correction encoding by an encoding/interleaver block 22 which generates forward error correction encoded data which is then fed to a modulation unit 24 which maps the encoded data onto modulation symbols which are used to modulate OFDM symbols. Depicted on a separate lower arm, signalling data providing physical layer signalling for indicating for example the format of coding and modulation of the audio/video data is generated by a physical layer signalling unit 30 and after being encoded by an encoding unit 32, the physical layer signalling data is then modulated by a modulation unit 24 as with the audio/video data.

A frame builder 26 is arranged to form the data to be transmitted with the physical layer signalling data into a frame for transmission. The frame includes a time divided section having a preamble in which the physical layer signalling is transmitted and one or more data transmission sections which transmit the audio/video data generated by the audio/video sources 20. An interleaver 34 may interleave the data which is formed into symbols for transmission by an OFDM symbol builder 36 and an OFDM modulator 38. The OFDM symbol builder 36 receives pilot signals which are generated by a pilot and embedded data generator 40 and fed to the OFDM symbol builder 36 for transmission. The output of the OFDM modulator 38 is passed to a guard insertion unit 42 which inserts a guard interval and the resulting signal is fed to a digital to analogue convertor 44 and then to an RF front end 46 before being transmitted by an antenna 48.

Figure 3:
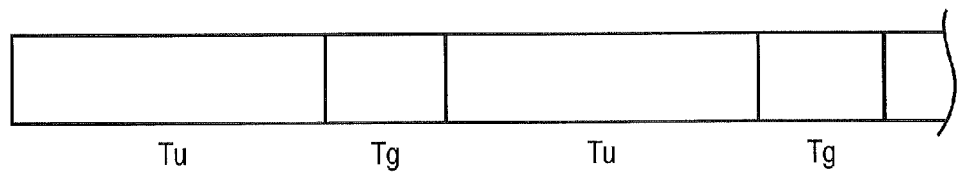
FIG. 3 provides a schematic illustration of OFDM symbols in the time domain which include a guard interval.

As with a conventional arrangement OFDM is arranged to generate symbols in the frequency domain in which data symbols to be transmitted are mapped onto sub carriers which are then converted into the time domain using an inverse Fourier Transform which may comprise part of the OFDM modulator 38. Thus the data to be transmitted is formed in the frequency domain and transmitted in the time domain. As shown in FIG. 3 each time domain symbol is generated with a useful part of duration Tu seconds and a guard interval of duration Tg seconds. The guard interval is generated by copying a part of the useful part of the symbol with duration Tg in the time domain, where the copied part may be from an end portion of the symbol. By correlating the useful part of the time domain symbol with the guard interval, a receiver can be arranged to detect the start of the useful part of the OFDM symbol which can be used to trigger a Fast Fourier Transform to convert the time domain symbol samples into the frequency domain from which the transmitted data can then be recovered. Such a receiver is shown in FIG. 4.

Figure 4:
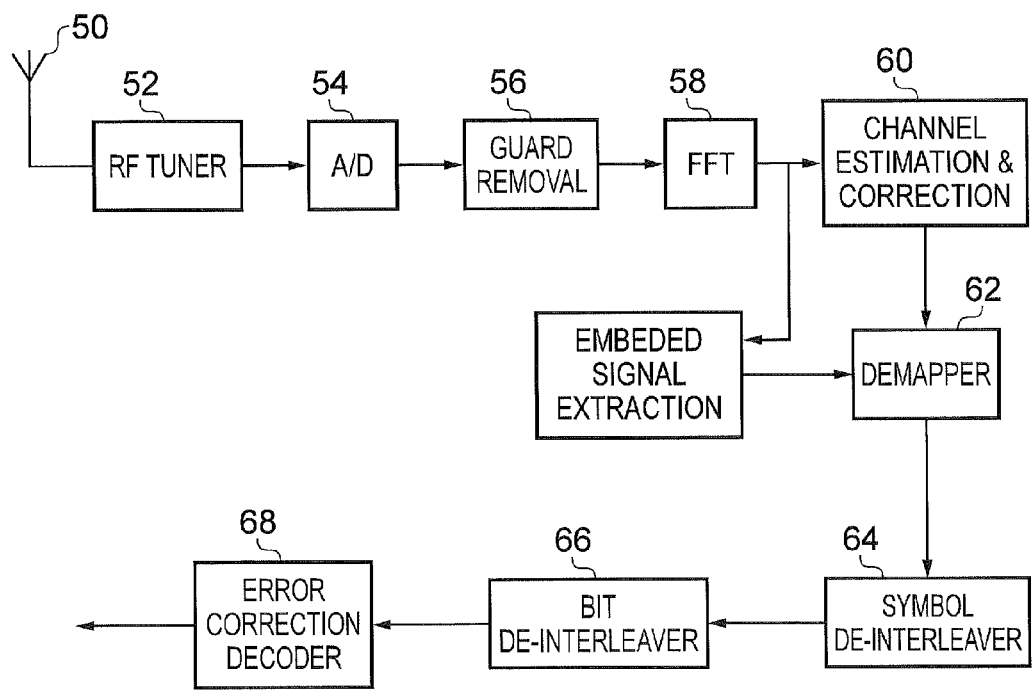
FIG. 4 provides a schematic block of a typical receiver for receiving data broadcast by the broadcast transmission network of FIG. 1 using OFDM.

In FIG. 4 a receiver antenna 50 is arranged to detect an RF signal which is passed via a tuner 52 and converted into a digital signal using an analogue to digital converter 54 before the guard interval is removed by a guard interval removal unit 56. After detecting the optimum position for performing a fast Fourier Transform (FFT) to convert the time domain samples into the frequency domain, an FFT unit 58 transforms the time domain samples to form the frequency domain samples which are fed to a channel estimation and correction unit 60. The channel estimation and correction unit 60 estimates the transmission channel used for equalisation for example by using pilot sub-carriers which have been embedded into the OFDM symbols. After excluding the pilot sub-carriers, all the data-bearing sub-carriers are fed to a de-mapper unit 62 which extracts the data bits from the sub-carriers of the OFDM symbol. These data bits are then fed to a de-interleaver 64 which de-interleaves the sub-carrier symbols. The data bits are now fed to a bit de-interleaver 66, which performs the de-interleaving so that the error correction decoder can correct errors in accordance with a conventional operation.

Framing Structure

Figure 5:
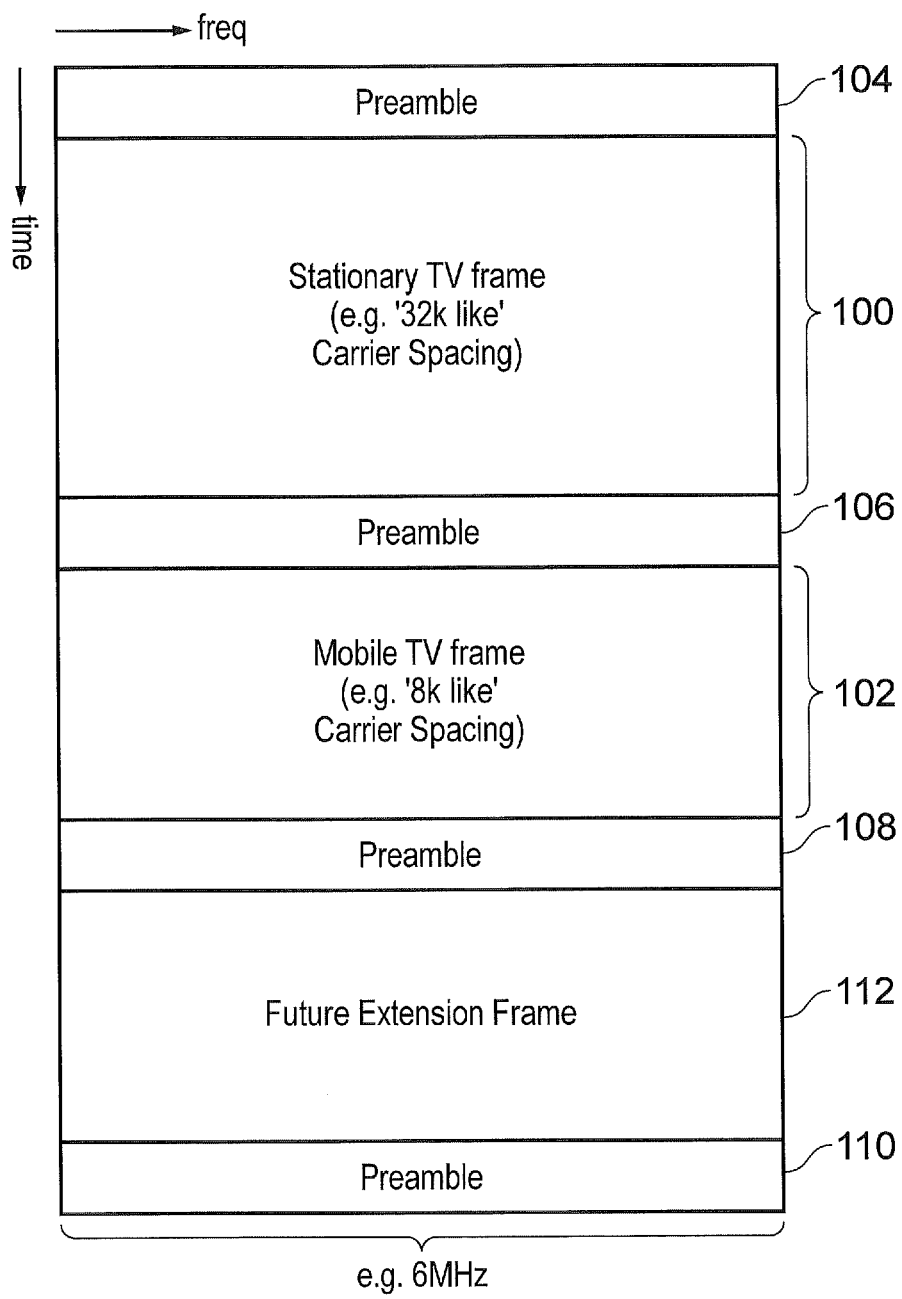
FIG. 5 provides a schematic illustration of a sequence of transmission frames for transmitting broadcast data and payload data separated by a preamble carrying signalling data.

FIG. 5 shows a schematic diagram of the framing structure of a frame that may be transmitted and received in the systems described with reference to FIGS. 1 to 4. FIG. 5 illustrates different physical layer frames, some targeted for mobile reception whilst others are targeted for fixed roof-top antenna reception. The system can be expanded in future to incorporate new types of frames, for the current system, these potential new types of frames are simply known as future extension frames (FEFs).

The framing structure shown in FIG. 5 is therefore characterised by frames which may each include payload data modulated and encoded using different parameters. This may include for example using different OFDM symbol types having different number of sub-carriers per symbol, which may be modulated using different modulation schemes, because different frames may be provided for different types of receivers. However each frame may include at least one OFDM symbol carrying signalling data, which may have been modulated differently to the one or more OFDM symbols carrying the payload data. Furthermore for each frame, the signalling OFDM symbol may be a different type to the OFDM symbol(s) carrying the payload data. The signalling data is required to be recovered so that the payload data may be de-modulated and decoded.

Bootstrap Signal

Figure 6:
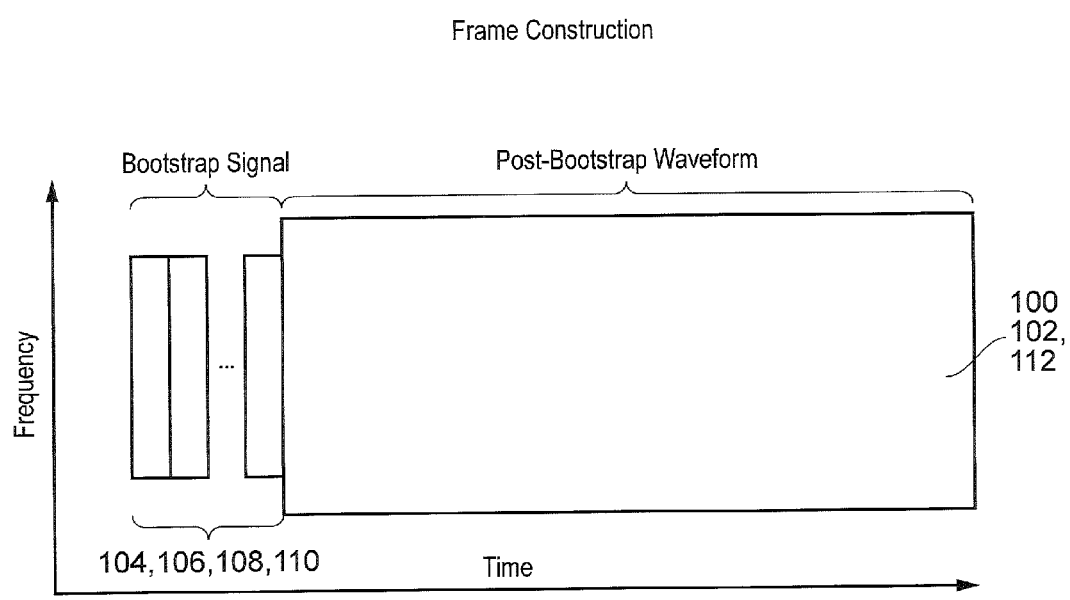
FIG. 6 provides a schematic representation of a preamble of one of the transmission frames shown in FIG. 5, which includes a so-called "bootstrap" signal or waveform comprised of multiple OFDM symbols.

As explained in [1], the bootstrap signal provides a universal entry point into an ATSC way form. The bootstrap signal is supposed to have a known configuration in that the sampling rate, the signal bandwidth, the sub carrier spacing and time domain structure are known a priori at the receivers. FIG. 6 provides a schematic representation of the form of a bootstrap signal with respect to the data carrying frames shown in FIG. 5. In FIG. 6 the bootstrap signal, which may form part of the preamble 104, 106, 108, 110, precedes a data-bearing frame 100, 102, 112. The bootstrap signal comprises four or more OFDM symbols beginning with a synchronisation symbol positioned at the start of each frame to enable service discovery, coarse time synchronisation, frequency offset estimation and initial channel estimation. The remaining other bootstrap OFDM symbols contain sufficient control signalling to provide communications parameters to allow the received signal to be decoded for the remaining part of the frame. Thus the bootstrap signal carries signalling information to enable a receiver to discover the parameters with which the data-bearing frame has been configured so that a receiver can detect and recover this data.

Figure 7:
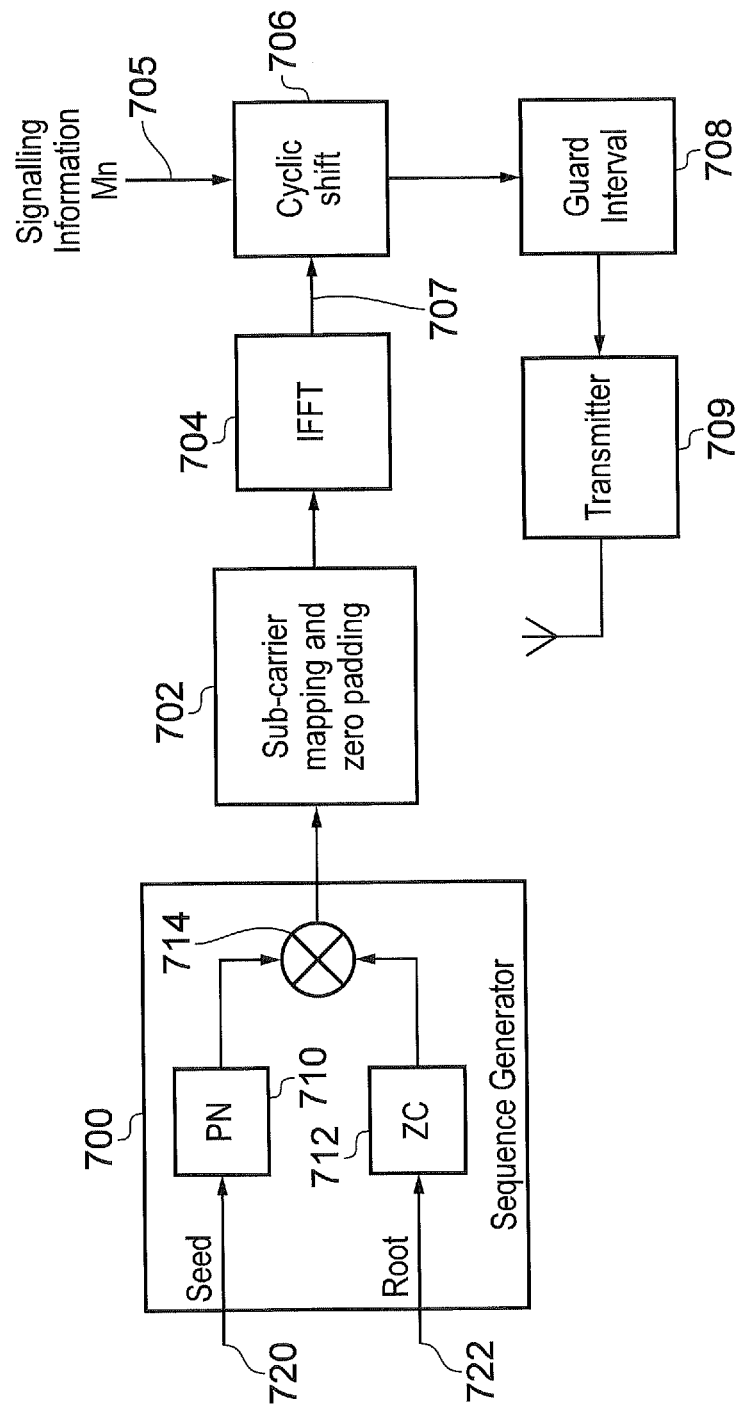
FIG. 7 provides a schematic block diagram of a part of the transmitter shown in FIG. 2 for transmitting a bootstrap signal comprising a plurality of bootstrap, OFDM symbols.

A schematic block diagram of a part of the transmitter shown in FIG. 2 which is configured to transmit a bootstrap signal is shown in FIG. 7. In FIG. 7 a signature sequence generator 700 is arranged to generate a signature sequence which is mapped onto the sub carriers of an OFDM symbol forming the bootstrap symbol by the sub carrier mapping and zero padding unit 702. The frequency domain signal is then transformed into the time domain by an inverse Fourier transform 704. Signalling information which is to be transmitted with the bootstrap signal is fed on a first input 705 to a cyclic shift unit 706. The cyclic shift unit 706 also receives on a second input 707 the time domain OFDM representing the bootstrap symbol. As will be explained below, signalling information is represented as a cyclic shift of the bootstrap OFDM symbol in the time domain. The cyclically shifted bootstrap OFDM symbol is then fed to a guard interval insertion unit 708, which adds a guard interval to the bootstrap OFDM symbol in the form in which the OFDM symbol forming of the bootstrap symbol will be transmitted by a transmitter unit 709.

As shown in FIG. 7 the signature sequence generator 700 generates a signature sequence comprising a pseudo random sequence generator 710 and a Zadoff-Chu sequence generator 712. These two sequences are multiplied together by a multiplier 714 before the combined sequences are mapped onto the sub carriers of the OFDM symbol by the sub carrier mapping and zero padding unit 702. As shown in FIG. 7 the seed value for the pseudo random number generator 710 is fed on a first input 720 and a second input 722 provides an indication of the route of the Zadoff-Chu sequence generator 712.

Figure 8:
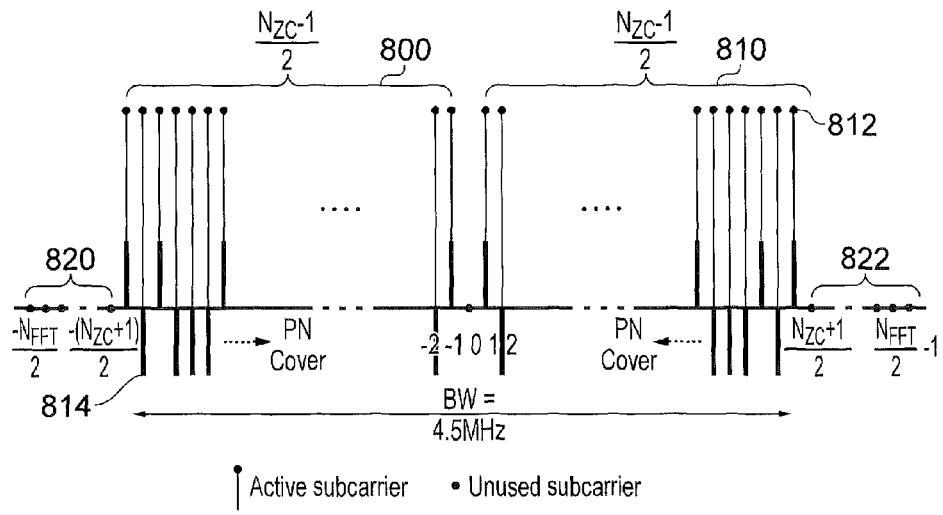
FIG. 8 provides a schematic representation of a bootstrap OFDM symbol in the frequency domain.

The mapping of the Zadoff-Chu (ZC) sequence modulated by a pseudo random sequence or pseudo noise (PN) to form the signature sequence onto the OFDM symbol in a symmetrical way is shown in FIG. 8.

As shown in FIG. 8, in the frequency domain, the bootstrap signal can be regarded as comprising two halves 810 of a symmetrical Zadoff-Chu (ZC) sequence. Each symbol in the Zadoff-Chu sequence is arranged to modulate an active carrier 812. Correspondingly the PN sequence is arranged to modulate the sub-carriers as shown by the lines 814. Other sub carriers of the bootstrap symbol are not used and so are set to zero as shown for example at either end of the bootstrap signal 820, 822.

As shown in FIG. 8 the ZC sequence and the PN sequence are mapped to the OFDM sub-carriers in a manner that produces a reflective symmetry about the central DC sub carrier of the OFDM symbol. The subcarrier values for the n-th symbol of the bootstrap ($0 \leq n < N_B$) may be calculated as in the following equation, where $N_H = (N_{ZC}-1)/2$, $N_B$ is the number of bootstrap symbols and p(k) are elements of the PN-sequence The ZC sequence determined by its root q, may be the same for each symbol, while the PN sequence shall advance with each symbol.

$$s_n(k) = \begin{cases} z_q(k+N_H) \times c((n+1) \times N_H + k) & -N_H \leq k \leq -1 \\ z_q(k+N_H) \times c((n+1) \times N_H - k) & 1 \leq k \leq N_H \\ 0 & \text{otherwise} \end{cases}$$

c(k)=1−2×p(k) with c(k) having either the value +1 or −1.

The final bootstrap symbol is inverted in phase (i.e. a rotation of 180°) of the subcarrier values for that particular symbol. This provides an indication of the definite end of the bootstrap signal. This is provided in case there are further bootstrap OFDM symbols, in which case a receiver is provided with a definite indication of the last bootstrap OFDM symbol. That is to say any number of bootstrap OFDM symbols may be used. Accordingly, receivers can detect the phase inversion and so detect the end of the bootstrap signal.

$$\tilde{s}_n(k) = \begin{cases} s_n(k) & 0 \le n < N_B - 1 \\ -s_n(k) & n = N_B - 1 \end{cases}$$

In one example, signalling data can be conveyed in the bootstrap signal by performing a data-determined cyclic shift of the symbol in the time domain. This is performed by the cyclic shift blocks shown in FIG. 7. The process for conveying signalling bits is summarised in FIG. 9.

Figure 9:
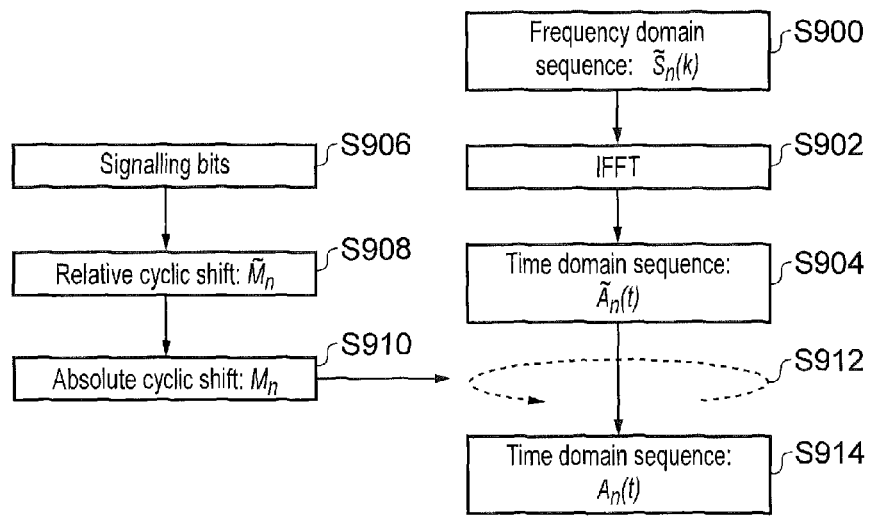
FIG. 9 is an illustrative flow diagram representing the operation of the transmitter in imprinting the signalling data, which is transported on one or more of the bootstrap OFDM symbols by cyclically shifting the time domain symbol sequence.

In FIG. 9 the frequency domain sequence is formed by the sequence generator 700 in the frequency domain in step S900. In step S902 an inverse Fourier transform is performed by the IFFT module 704 to convert the frequency domain signal into the time domain. Thus in step S904 the sequence is formed in the time domain. As shown in step S906 the signalling bits are formed and then interpreted in step S908 as a relative cyclic shift value and in step S910 the relative shift value is converted to an absolute shift value. As shown by arrow S912 the time domain sequence formed in step S904 is then shifted in accordance with the absolute cyclic shift determined in step S910. Finally, in step S914 the time domain sequence to be transmitted is produced.

Time Domain Structure

Figure 10:
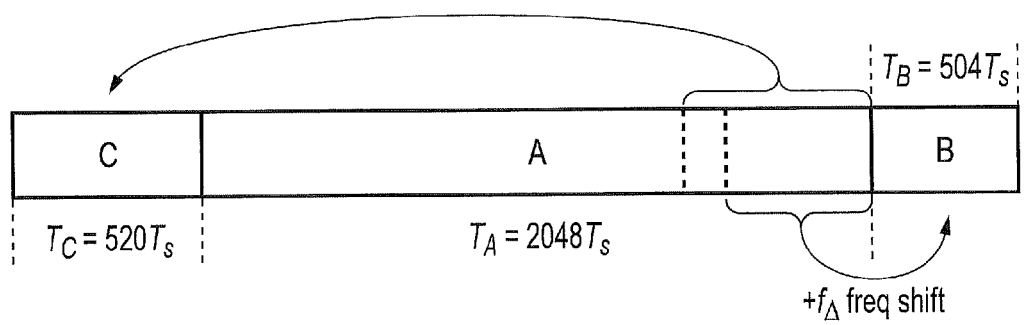
FIG. 10 provides a schematic representation of a time domain structure of a first of the bootstrap OFDM symbols.
Figure 11:
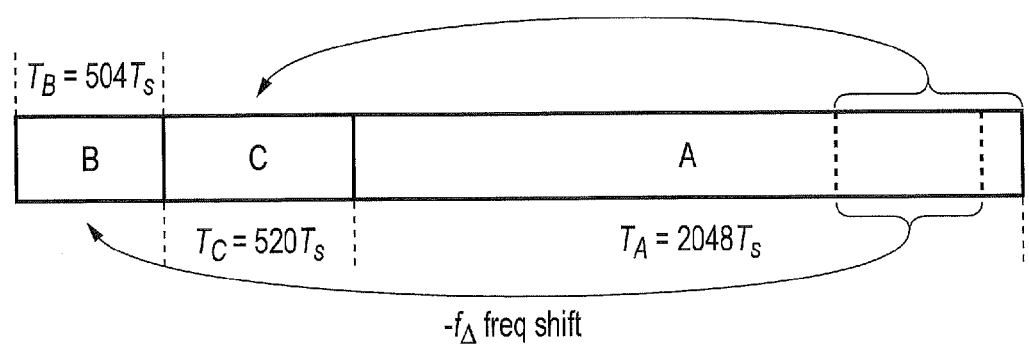
FIG. 11 provides a schematic representation of a second time domain structure of one or more other bootstrap OFDM symbols.

Each of the bootstrap OFDM symbols can be interpreted as being comprised of three parts which are referred to as A, B and C. As explained above, an OFDM symbol is usually formed with a guard interval generated by copying a section of the OFDM symbol in the time domain as a preamble to the OFDM symbol in order to account for multi path reception at the receiver. Each bootstrap symbol is formed in one of two ways. The different formation of the bootstrap symbols in the time domain is shown in FIGS. 10 and 11. As shown in both FIGS. 10 and 11 the data carrying part of the symbol that is the original formation of the OFDM symbol before guard intervals are added is represented as section A. Thus, section A is derived as the IFFT of the frequency domain structure with or without the cyclic shift explained above to represent the signalling bits being conveyed by the bootstrap symbol. Parts B and C are composed of samples taken from the end of A with a frequency shift of $\pm f_A$ which is equal to the sub carrier spacing introduced into the samples of B by the transmitter, and correspondingly removed at the receiver. Each bootstrap symbol consistently consists of 3072 samples.

There are two variations of the time domain structure of the bootstrap symbols which are referred to as C-A-B and B-C-A. The initial symbol of the bootstrap referred to as bootstrap symbol zero is provided for synchronisation detection and employs the C-A-B structure which is shown in FIG. 10 and applies a frequency shift of $+f_A$ to part B. The remaining bootstrap symbols use the B-C-A structure including the final bootstrap symbol with a phase inversion which provides the termination of the bootstrap signal as explained above and applies a frequency shift of $-f_A$ to part B.

Bootstrap Detector

Figure 12:
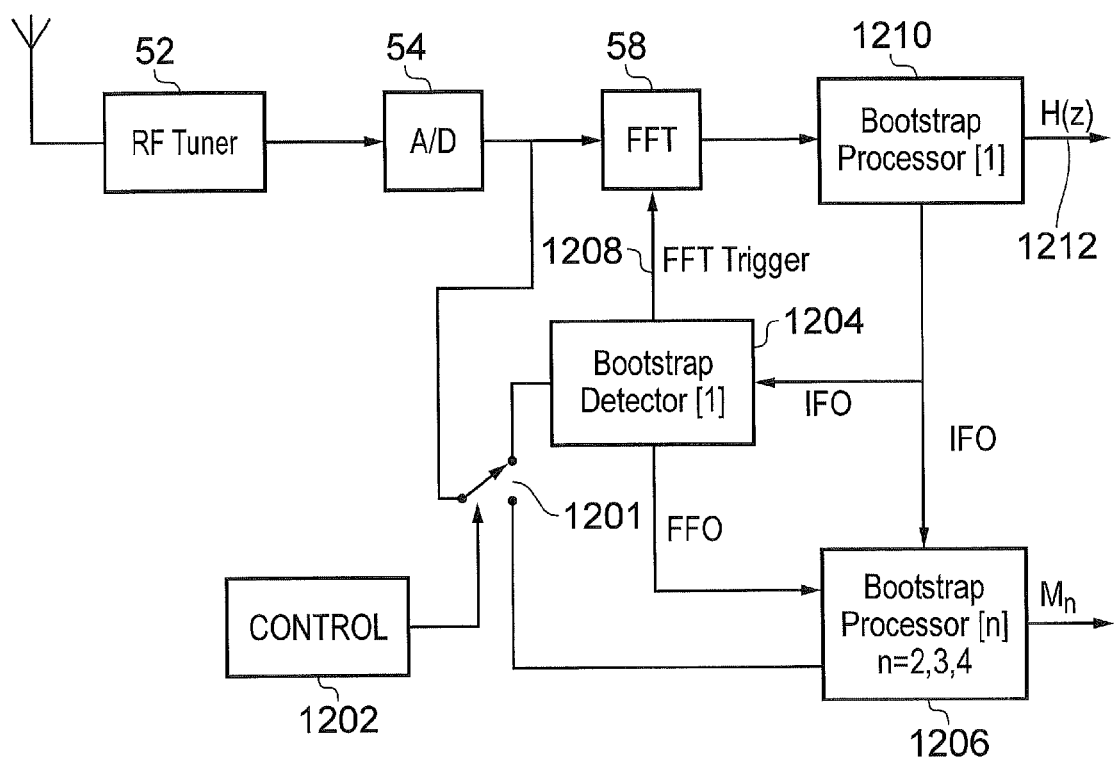
FIG. 12 is a schematic block diagram of an example receiver for detecting and recovering signalling from the one or more bootstrap OFDM symbols.

A schematic block diagram illustrating an adaptation of the receiver shown in FIG. 4 when operating to detect the bootstrap signal is shown in FIG. 12. As shown in FIG. 4 the signal detected by an antenna 50 is fed to an RF tuner 52 and then to an A to D converter 54. The received digitally sampled signal is then fed to a Forward Fourier Transform processor 58 and also to a first input of a switch 1201, which is controlled by a controller 1202 to switch the received digitally sampled signal between a bootstrap detector 1204 and a second of two bootstrap processors 1206, 1210. The bootstrap detector 1204 generates a trigger signal fed on a channel 1208 to the FFT processor 58 in order to identify a most useful part of the received signal which is to be converted from the time to the frequency domain to validate the bootstrap signal and to recover the signalling data. An output of the FFT processor 58 provides a frequency domain version of the received signal to a first of the bootstrap processors 1210. The first bootstrap processor 1210 is configured to generate a first estimate of the channel transfer function (CTF) H(z) at an output channel 1212.

Figure 13:
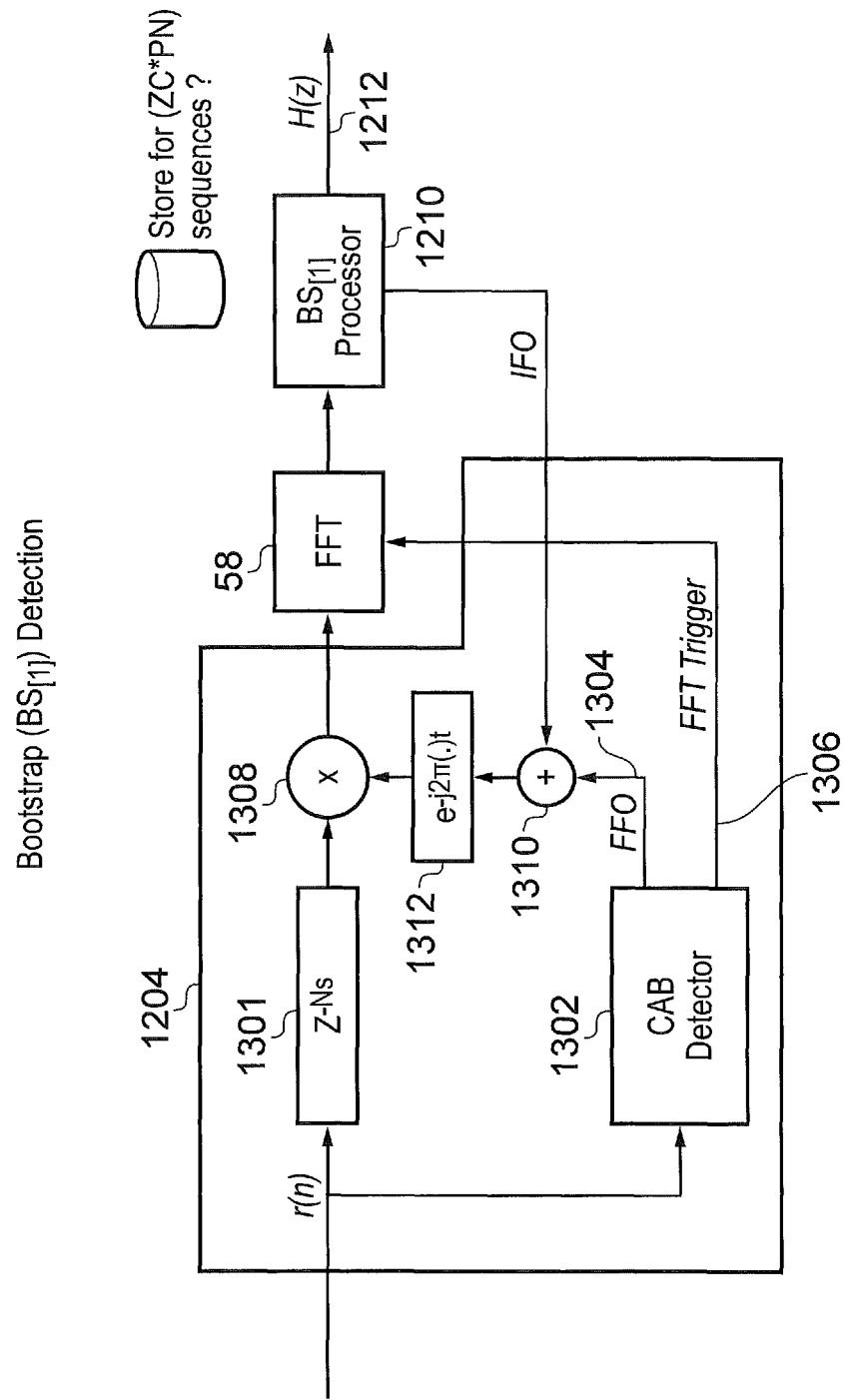
FIG. 13 is a schematic block diagram of a receiver for detecting a bootstrap OFDM symbol including identifying a trigger time for performing a forward Fourier transform on an OFDM symbol.
Figure 14:
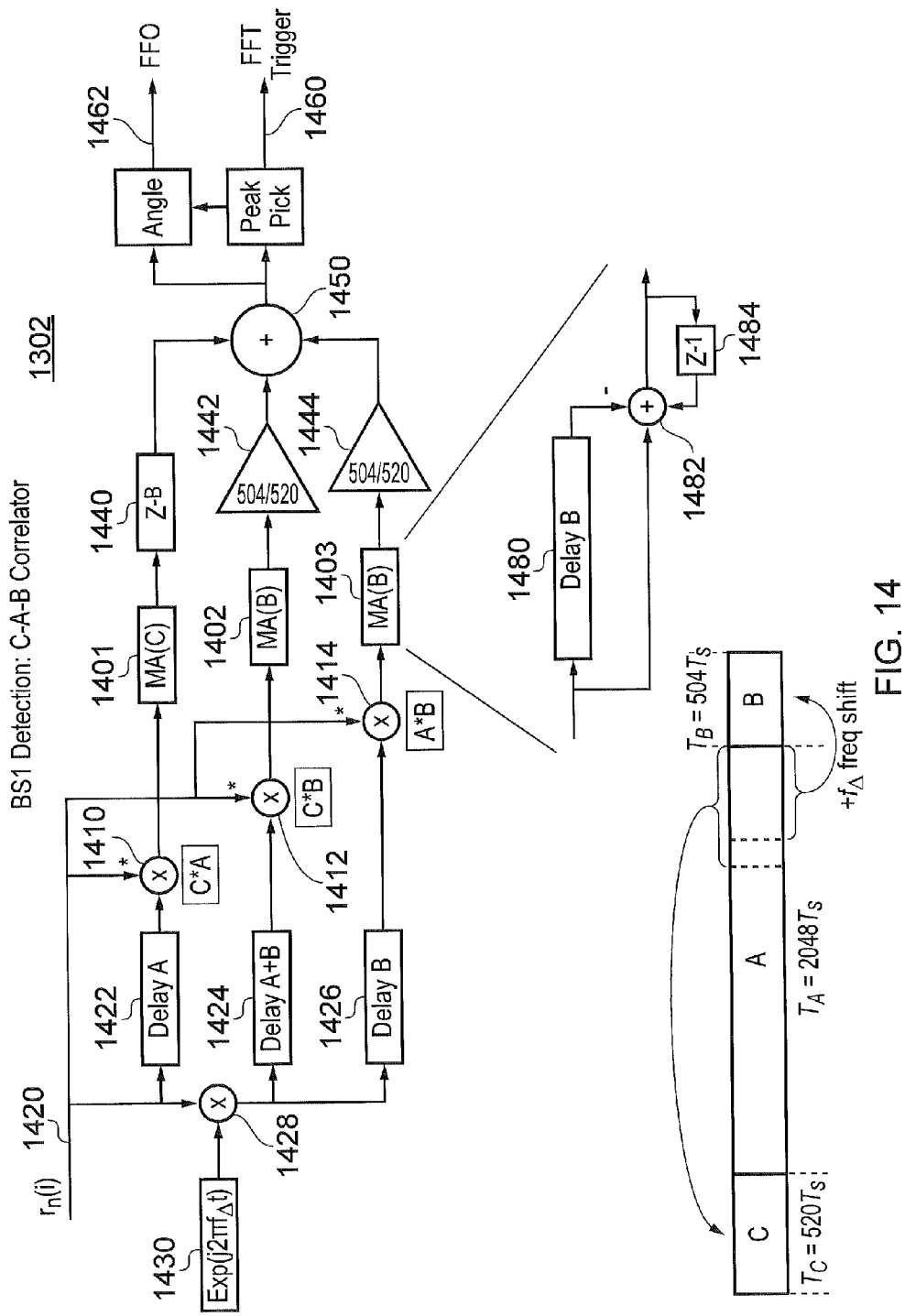
FIG. 14 is a more detailed example of the CAB detector of FIG. 14, which includes a detector for identifying the triggering time for performing a forward Fourier transform from a first of the bootstrap OFDM symbols having the first time domain structure of FIG. 10.
Figure 15:
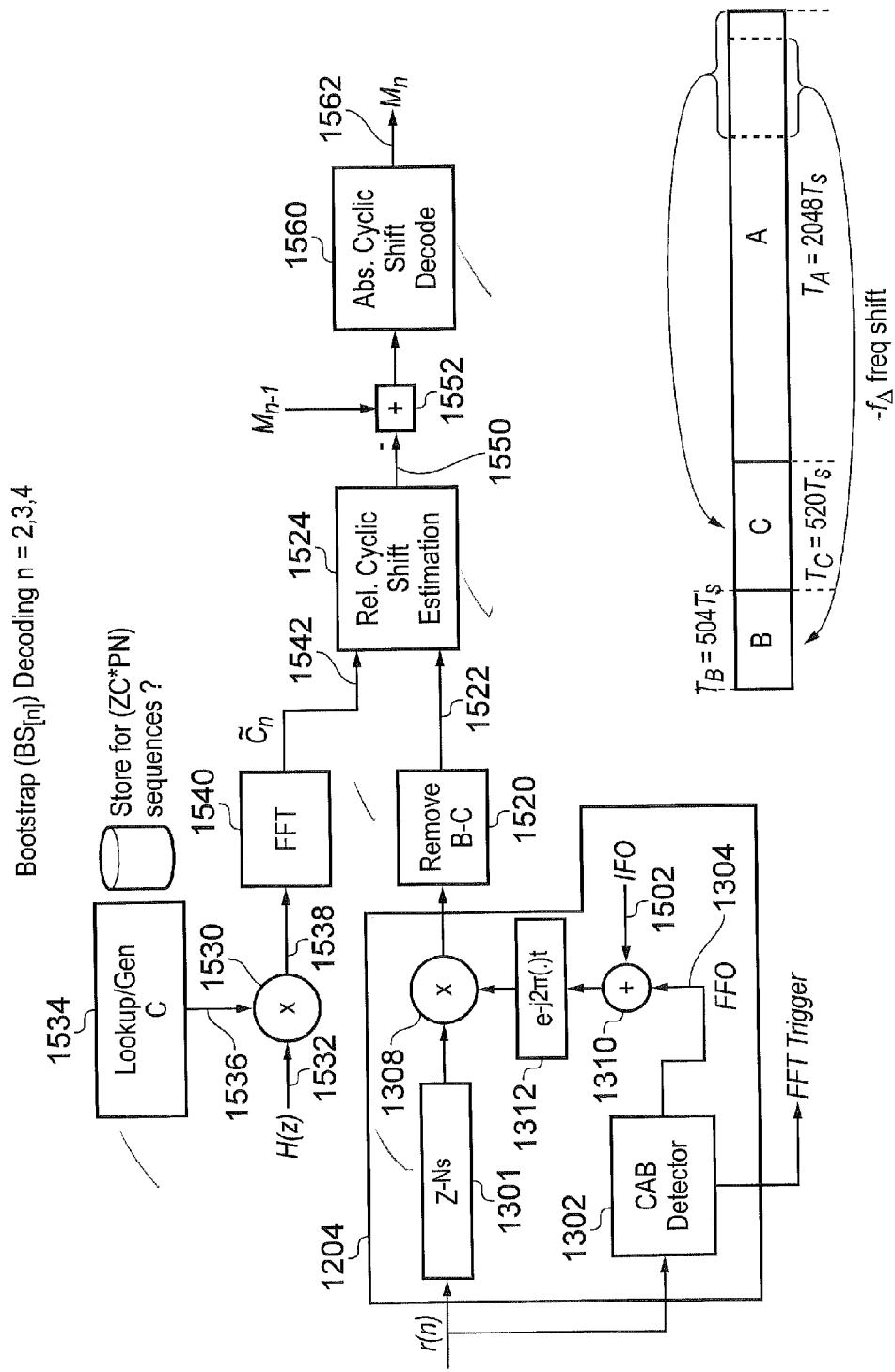
FIG. 15 is a schematic block diagram of a bootstrap OFDM symbol processor for estimating the cyclic shift that was used by the transmitter to imprint the signalling data on to one or more detected bootstrap OFDM symbols.

Example detectors of the bootstrap symbols of the bootstrap signal are provided in FIGS. 13, 14 and 15. As indicated above only the first bootstrap symbol has the C-A-B structure which is transmitted to provide initial synchronisation. FIG. 13 provides an example block diagram of a detector for the first bootstrap symbol. As shown in FIG. 13 the received discrete time signal r(n) is fed to a delay unit 1301 and a C-A-B structure detector 1302. The C-A-B structure detector 1302 will be explained in more detail with reference to FIG. 14 shortly. The C-A-B structure detector 1302 generates on a first output 1304 an estimate of a fine frequency offset (FFO), which is a frequency shift smaller than the OFDM symbol sub-carrier spacing and which may have occurred during the transmission of the bootstrap OFDM symbol. Also output from a second channel 1306 is an indication of a timing trigger for indicating the period of the received OFDM symbol which is transformed by the FFT processor 58, so as to capture as far as possible a maximum amount of energy of the received OFDM bootstrap symbol. However before transforming the received bootstrap symbol into the frequency domain, a total frequency offset is removed by a multiplier 1308. The multiplier 1308 receives on a first input the delayed received signal from the delay unit 1301 and on a second input an inverse of a total frequency offset which is formed by an adder 1310 and a tone generator 1312. The total frequency offset is formed by the adder 1310 from at least one of the fine frequency offset (FFO) estimated by the C-A-B detector 1302 which is fed to a first input and an integer frequency offset (IFO) estimated by the bootstrap signal processor 1310. This total frequency offset is input into the tone generator 1310 causing it to generate a sinusoidal tone at a frequency equal to the total frequency offset. The bootstrap signal processor 1210 generates the IFO by correlating the frequency domain sub-carriers with a re-generated version of the signature sequence generated from a combination of the ZC sequence modulated with the PN sequence. The location of a peak of the correlation output is then used to estimate the IFO, which is a displacement in the frequency domain of a number of sub-carriers with respect to a frequency reference within the frequency band of the bootstrap signal. Thus the total frequency offset is estimated and removed by the multiplier 1308 and the tone generator 1210 from the FFO estimated by the CAB structure detector 1302 and the IFO estimated by the bootstrap signal processor 1210.

As indicated above the detector 1302 shown in FIG. 13 for detecting the first bootstrap OFDM symbol is used to generate a FFO and indicate the useful part of the input signal burst for Forward Fourier Transform (FFT). The detector 1302 shown in FIG. 13 is shown in more detail in FIG. 14. As shown in FIG. 14, one example of the C-A-B detector 1302 is provided with three moving averaging filters 1401, 1402, 1403 which are fed from the output of multipliers 1410, 1412, 1414. The received signal is input on a channel 1420 and fed respectively to three delay circuits 1422, 1424, 1426 which serve to delay the received signal by a number of samples respectively equal to the number in the A, A+B and B parts of the bootstrap symbol. A multiplier 1428 frequency shifts the received signal which is input to the second and third delay portions 1424, 1426 by a frequency shift corresponding to the frequency adjustment $\mp\Delta f$ fed from a tone generation circuit 1430. After respectively delaying the received signals by the number of samples in the A, A+B and B parts of the bootstrap symbol, the outputs respectively from the delay elements 1422, 1424, 1426 are fed to the multipliers 1410, 1412, 1414. The received signal is then multiplied by the multipliers 1410, 1412, 1414 from the output from the delay elements 1422, 1424, 1426 with a conjugated sample of the received signal samples to form in combination with the moving averaging filters 1401, 1402, 1403 a correlation of the received signal with respect to itself following the delay A, A+B and B. The outputs of the moving average filters 1401, 1402, 1403 are delayed by delay elements 1440 and up-scaled by scaling elements 1442, 1444 and summed by an adder 1450 to generate a peak combined sample by correlating each of the sections C, A and B of the received signal with their respective copies to identify a peak at which the FFT trigger point is detected at the output 1460. Correspondingly, the phase of the peak determines the FFO provided on the output 1462.

As shown also in FIG. 14 the moving average filter is formed from a delay element 1480 whose output is subtracted from its input and then added to a previous output to form a moving average sample correlation value.

FIG. 15 provides a schematic block diagram of a bootstrap decoder for decoding the second, third and fourth and any other following bootstrap OFDM symbols. As shown in FIG. 15 the received signal r(n) is received by a delay unit 1301 and fed to a multiplier 1308 which multiplies the signal received from the delay unit 1301 by a tone signal provided by a tone generation unit 1312. The total frequency offset is formed from adding the IFO fed to a first input 1502 to an adder 1310 with a second input 1304 being provided with an indication of the FFO. Both the FFO and the IFO may be generated by the bootstrap processor of the first bootstraps OFDM symbol shown in FIGS. 13 and 14 as explained above. The received signal which is delayed by $N_S=3072$ samples and after the total frequency offset has been removed is then fed to a B–C removal unit 1520. The B–C removal unit 1520 isolates the useful portion A of the bootstrap symbol which is then fed to a first input 1522 of a relative cyclic shift estimation unit 1524.

A first input 1532 to a multiplier 1530 receives an estimate of the channel H(z) in the frequency domain and a second input 1536 receives a signature sequence provided from a look-up table 1534. The multiplier forms at an output 1538 a multiplication of the channel frequency response and the signature sequence in the frequency domain, which is equivalent to convolution with the channel impulse response in the time domain. The output 1538 is therefore a channel-shaped version of the signature sequence (ZC sequence combined with PN sequence), which is fed to an inverse Fourier transform processor 1540 which converts the channel-shaped signature sequence into the time domain which is fed to a second input 1542 of the relative cyclic shift estimation unit 1524.

The relative cyclic shift estimation unit 1524 then cyclically correlates the received useful portion of the first bootstrap OFDM symbol with the channel-shaped signature sequence to identify a relative cyclic shift of the signature sequence as formed at the transmitter. The output 1550 of the relative cyclic shift estimation unit 1524 is fed to an adder 1552 which subtracts from the cyclic shift detected from the previous symbol. Accordingly an absolute cyclic shift decoding unit 1560 is used to decode the total cyclic shift on the received OFDM symbol which is then output as $M_n$ on an output channel 1562.

The example shown in FIG. 15 provides an example of a time domain correlator which is configured to detect a cyclic shift of the signature sequence and therefore the signalling information carried by the bootstrap symbol n, where n>1. A more detailed explanation of the example shown in FIG. 15 will be given below.

Combined Correlator

Embodiments of the present technique can provide an arrangement in which the separate detectors for the time delayed structure of the OFDM bootstrap symbols are combined in order to increase an accuracy with which the FFT trigger point and fine frequency offset is determined. As explained above, a conventional arrangement only uses the first OFDM bootstrap symbol to detect the FFO and the FFT trigger point. However embodiments of the present technique are arranged to combine all of the bootstrap symbols to form an estimate of the FFT trigger point and the fine frequency offset with improved accuracy. An example embodiment is shown in FIG. 16.

Figure 16:
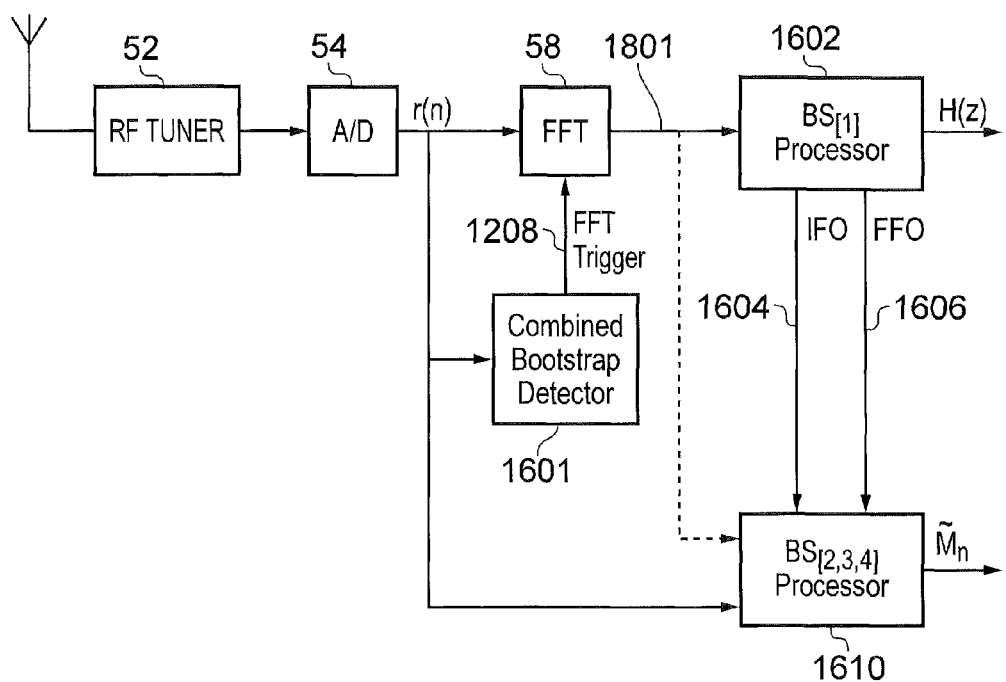
FIG. 16 is a schematic block diagram of an example receiver for detecting bootstrap OFDM symbols which includes a combined bootstrap signal detector for identifying a trigger time for performing a forward Fourier transform on an OFDM symbol according to the present technique.

FIG. 16 corresponds to the bootstrap receiver shown in FIG. 12 but has been adapted in accordance with the present technique to provide improvements in detecting the bootstrap signal. Therefore, only differences between FIGS. 12 and 16 will now be described.

As shown in FIG. 16 the received signal r(n) is fed from the output of the A/D convertor 54 to an input of a combined bootstrap detector 1601. As we explain in more detail below with reference to FIG. 17, the combined bootstrap detector 1601 uses all of the bootstrap OFDM symbols to detect the FFT trigger point fed on the output channel 1208. Furthermore, in contrast to the bootstrap receiver shown in FIG. 12, the arrangement shown in FIG. 16 shows a bootstrap processor for the first OFDM symbol 1602 configured to generate an indication of the TO on a first channel 1604 and an indication of the FFO on a second channel 1606. Both channels 1604, 1606 providing an indication of the IFO and the FFO respectively are fed to the second bootstrap processor 1610 which decodes the second, third and fourth bootstrap OFDM symbols to generate an indication of the signalling information $M_n$ communicated by these OFDM symbols.

Figure 17:
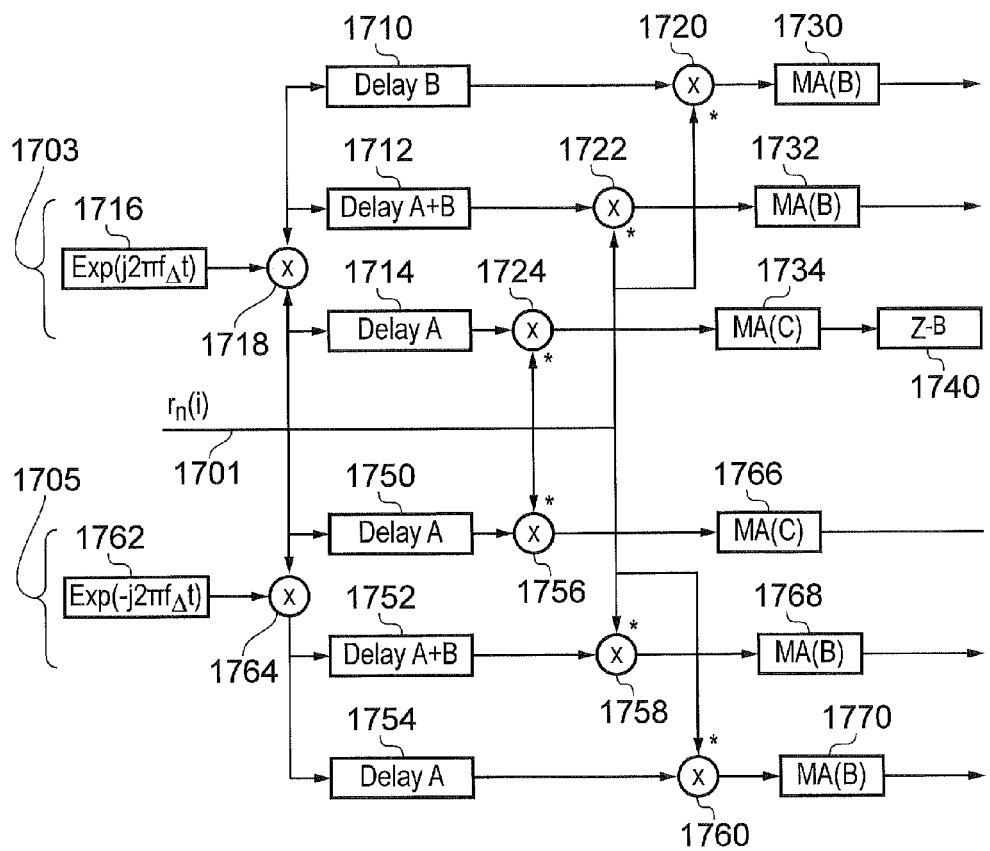
FIG. 17 is a schematic block diagram of a bootstrap signal detector, which is configured to provide an improved estimate of an identified trigger time for performing an FFT on received OFDM symbols from four OFDM symbols of a bootstrap signal in accordance with the present technique.
Figure 17:
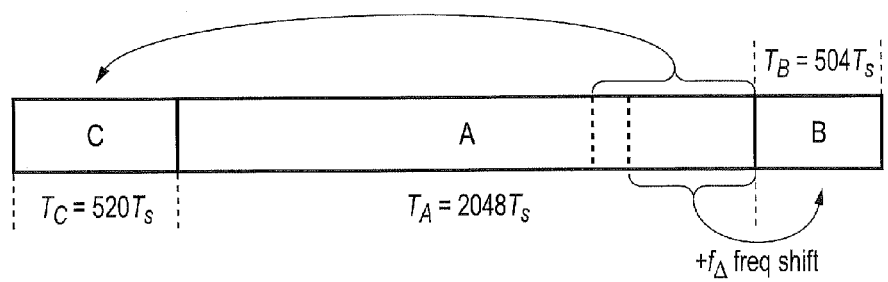
Figure 17:
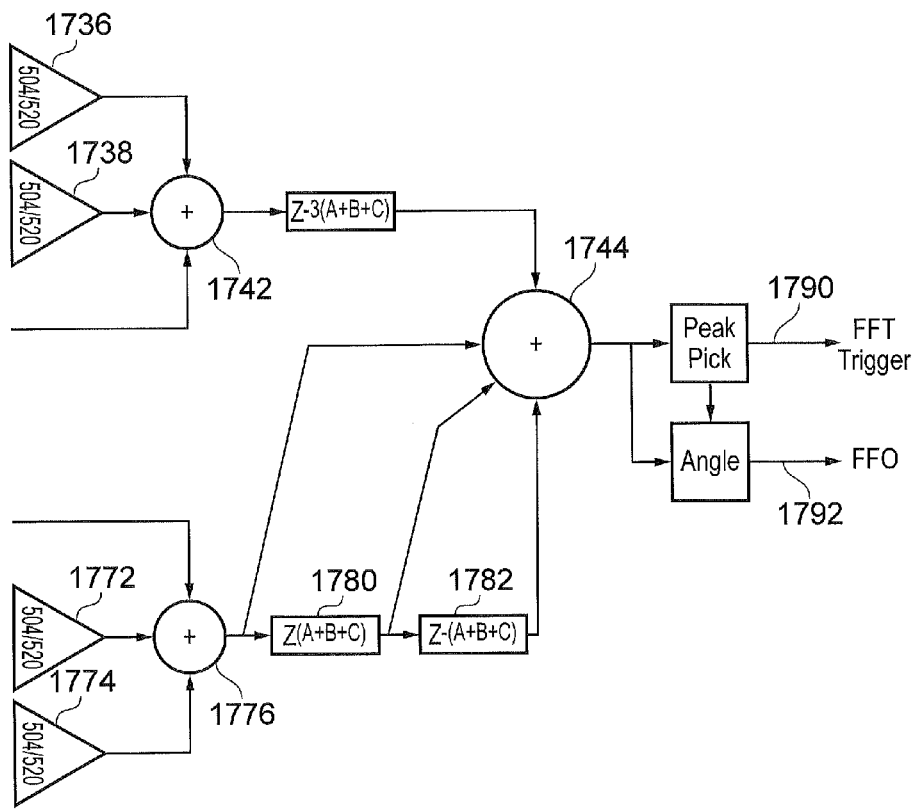
Figure 17:
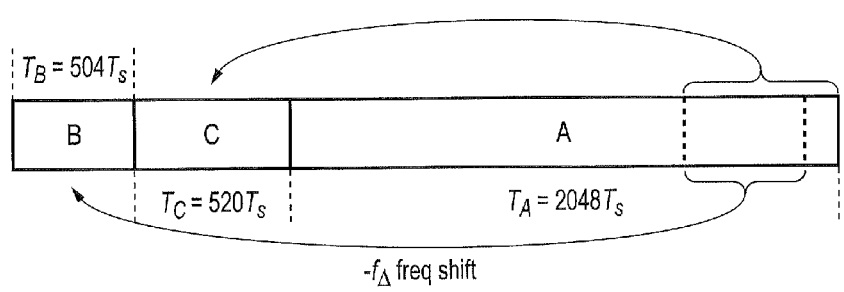

As shown in FIG. 17, a bootstrap signal detector according to an embodiment of the present technique is arranged to detect and to recover a timing for the FFT trigger and the FFO from the two types of time domain structures of the OFDM symbols of the bootstrap signal. Accordingly, a mirrored structure about the received input channel 1701 is provided for correlating the B–C–A correlator 1705 and the C–A–B correlator 1703 respectively. Each of the respective correlators forms a correlation sum for the respective structures of the OFDM bootstrap symbols. The first correlator 1703 is the C–A–B correlator that is used for detecting that first bootstrap symbol. This has already been described above. The difference here is that the output of the last adder 1742 is delayed by a number of samples equivalent to the duration of all the other bootstrap symbols i.e. a total of three times A+B+C samples time in a system with four bootstrap symbols before being fed to an input of a final adding (combiner) stage 1744 which combines the results from all the B–C–A correlators pertaining to the rest of the bootstrap symbols Correspondingly in respect of the lower correlator for the B–C–A branch, delay elements 1750, 1752, 1754 form in combination with the multipliers 1756, 1758, 1760 a multiplication of each of the samples of the received signal conjugated and multiplied by a corresponding delayed sample delayed respectively by the number of samples in the A, A+B, A part of the bootstrap symbol. As with the first branch a tone generator 1762 offsets the frequency of the lower two branches which are multiplied by multipliers 1764 to adjust the frequency of the lower two branches by $-f_A$. The moving average filters 1766, 1768, 1770 serve to perform a moving average of the multiplier output samples which are then fed via gain units 1772, 1774 to an adder 1776. The outputs are then fed to the adder 1744 representing the correlation contribution from the last bootstrap symbol. The output of adder 1776 is also delayed by an amount which is equivalent to the total number of samples in one bootstrap OFDM symbol. The output of delay element 1780, representing the correlation contribution from the third bootstrap symbol, is also fed to the adder 1744. The output of delay element 1780 is in turn also delayed by an amount which is equivalent to the total number of samples in one bootstrap OFDM symbol using the delay element 1782 whose output is then also fed as the correlation contribution from the second bootstrap symbol, to the adder 1744. Thus in combination the two branches 1703, 1705 serve to combine the correlation sums for all the OFDM symbols on the bootstrap signal to generate as an output 1790 a combined estimate of the optimum trigger point and an estimate of the fine frequency offset as an output 1792.

As for the first correlator 1703, for the lower correlator 1705, the first delay element 1750, the first multiplier 1756 and the first moving averaging filter 1766 together form a first auto-correlator for a part A of the one or more other bootstrap OFDM symbols. The second delay element 1752, the second multiplier 1756 and the second moving averaging filter 1768 together form a second auto-correlator for a part C of the bootstrap OFDM symbol and the third delay element 1754, the third multiplier 1760 and the third moving averaging filter 1770 together form a third auto-correlator for a part B of the bootstrap OFDM symbol.

As will be appreciated, although in FIG. 16 the first bootstrap processor 1602 for processing the first bootstrap symbol and the second bootstrap processor 1610 for processing the one or more other bootstrap symbols are shown as separate processors, in other examples the first and second processors 1602, 1610 may be configured as the same bootstrap processor.

Bootstrap Processor for First OFDM Symbol

According to the present technique a receiver is configured to detect payload data carried by OFDM symbols in a received signal. The receiver comprises a radio frequency demodulation circuit configured to detect the received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols. A detector circuit is configured to detect, from one or more of the bootstrap OFDM symbols, a synchronisation timing for converting a useful part of the bootstrap OFDM symbols into the frequency domain, a bootstrap processor configured to detect, using the signature sequence, a frequency offset of the received signal and to estimate a channel transfer function from the first bootstrap OFDM symbol, and a demodulator circuit configured to recover the signalling data from the one or more bootstrap OFDM symbols using the estimate of the channel transfer function. The bootstrap processor comprises a forward Fourier transformer configured to convert the bootstrap OFDM symbols from the time domain into the frequency domain in accordance with the identified synchronisation timing, an up-sampler configured to form an up-sampled version of the bootstrap OFDM symbol, the up-sampled version comprising for each sub-carrier of the first bootstrap OFDM symbol a plurality of U samples representing each of the sub-carriers of the bootstrap OFDM symbol, and a cross-correlator. The cross-correlator is configured to cross-correlate a signature sequence, which was combined with the first bootstrap OFDM symbol at the transmitter, with the up-sampled version of the first bootstrap OFDM symbol to generate for each of the sub-carriers of the up-sampled version of the OFDM symbol a correlation result, and an output processor is configured to identify a peak correlation result generated by the cross-correlator, and to determine the frequency offset of the received signal, from a relative position of the peak correlation result in the frequency domain in accordance with a sub-carrier bandwidth of the up-sampled version of the bootstrap OFDM symbol.

Embodiments of the present technique can provide an arrangement for improving an accuracy with which a frequency offset which is present in a received signal carrying payload data as OFDM symbols, can be estimated using a bootstrap signal. According to the present technique, the bootstrap processor for detecting the bootstrap OFDM symbols is configured to receive the first bootstrap OFDM symbol and to form an up-sampled frequency domain version of the first bootstrap OFDM symbol, which has been up-sampled by a factor U. A cross-correlator in the bootstrap processor is then configured to perform a cross-correlation of the up-sampled bootstrap OFDM symbol with a re-generated version of the signature sequence to identify both an integer frequency offset with respect to a displacement in a number of sub-carriers from a reference frequency, which may have been introduced at the transmitter and a fine frequency offset caused by frequency shift introduced during transmission. By estimating the fine frequency offset with respect to a sample of the up-sampled version of the first bootstrap OFDM symbol, a more accurate estimate of the fine frequency offset can be determined.

Figure 18:
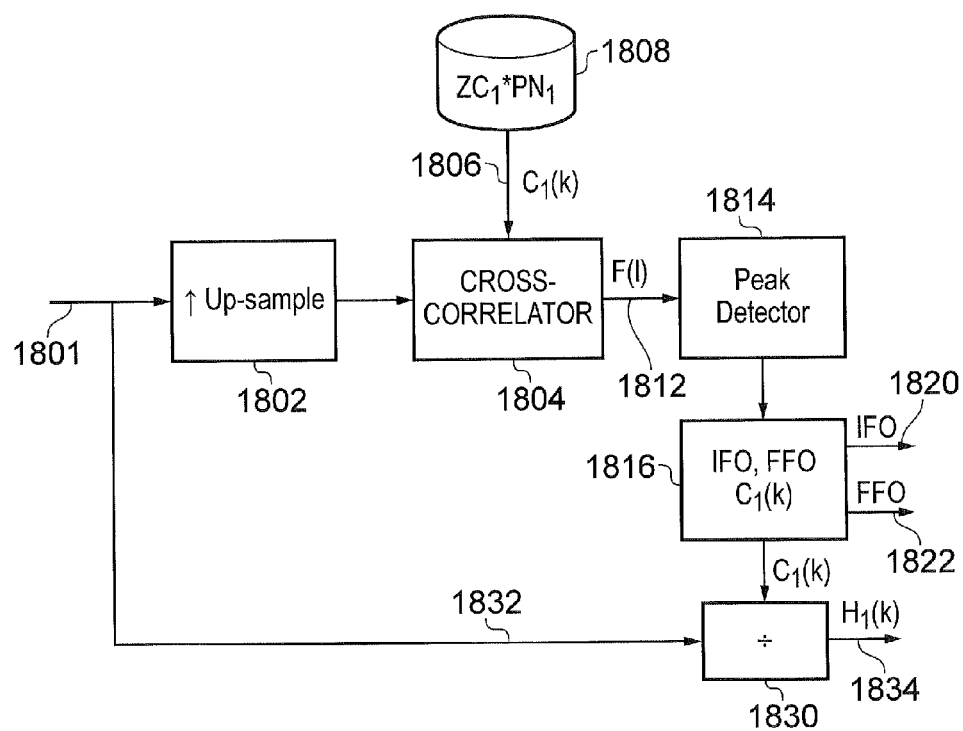
FIG. 18 is a schematic block diagram providing an example embodiment of a first bootstrap processor/decoder in accordance with the present technique.

A more detailed explanation of the features and operation of the first bootstrap processor shown in FIG. 16 will now be explained with reference to an example block diagram shown in FIG. 18. As shown in FIG. 18 the frequency domain samples representing the sub-carriers of the received OFDM symbol are fed to an up-sampling unit 1802. The frequency domain OFDM symbol is then up sampled in accordance with a factor U. The factor U maybe anyone or for example 4, 8, 16 so that if the OFDM symbol has 2048 sub-carriers then the number samples is increased to 8 k, 16 k or 32 k. In some embodiments, the up-sampling is achieved by writing the 2048 samples in the FFT window to the initial samples of an 8 k, 16 k or 32 k FFT input buffer for which the rest of the samples are set to zero. When the 8 k, 16 k or 32 k FFT is executed, its output is respectively a 4, 8 or 16 times up-sampling of the symbol spectrum. The up-sampled frequency domain OFDM symbol is then fed to a cross-correlator 1804. The cross correlator 1804 receives on a second input 1806 samples corresponding to one of the signature sequences which have been pre-stored in the data store 1808. Each pre-stored sequence represents the Zadoff-Chu sequence multiplied by one version of the PN sequence, which is fed to the cross correlator 1804. Each version of the PN sequence is generated using the same polynomial but with a different starting seed.

In one example the up-sampling unit 1802 is configured to form the up-sampled frequency domain version of the bootstrap OFDM symbol, by identifying samples of the bootstrap symbol in the time domain using the synchronisation timing, appending a plurality of zero valued samples to the samples of the bootstrap OFDM symbol, and performing a forward Fourier transform to convert the bootstrap OFDM symbol with the appended zero valued samples into the frequency domain, the number of zero valued samples being (U−1) time the number of samples of the bootstrap OFDM symbol in the time domain.

In accordance with the present technique the cross correlator 1804 correlates the up-sampled version of the OFDM symbol in turn with each of the base band sampled signature sequences to generate at an output 1812 samples of the cross correlation between the signature sequence and the up-sampled OFDM symbol. The signature sequence which provides the maximum cross-correlation is deemed to be the one used at the transmitter. The cross-correlation output from this signature sequence is then processed further.

A peak detector 1814 then detects the sample position of the cross correlation peak and so provides this indication to an output processor 1816. The output processor 1816 processes the position of the peak in the cross correlation output to identify, the signature sequence, the IFO and FFO which are output on channels 1820, 1822.

The cross-correlator therefore calculates the cross-correlation sum:

$$F(l) = \left\| \sum_{k=0}^{k=N_{ZC}-1} C_1^*(k) R(k+l) \right\|$$

where l=−E, −E+1, . . . 0, 1, E−1, E is the number of edge subcarriers in the boostrap symbols, so that for a 2 k OFDM symbol, then E=ceil((N$_{FFT}$−N$_{ZC}$)/2)=(ceil(2048−1499)/2)= 275.

The above calculation requires 2N$_{ZC}$E complex multiplies and 2N$_{ZC}$ Ecomplex adds. A potential simplification for the cross-correlator would be to take advantage of the symmetry of the signature sequence, and so perform the cross-correlation according to the following equation:

$$F(l) = \left\| \sum_{k=0}^{k=(N_{ZC}-1)/2} C_1^*(k)(R(k+l) + R(N_{ZC}-1-k-l)) \right\|$$

This calculation requires only N$_{ZC}$E complex multiplies and 2N$_{ZC}$E complex adds, and therefore has an advantage of the reducing the complexity of calculating the cross-correlation.

The signature sequence identified may be one out of eight possible sequences. From the FFT sample or frequency bin identified by the output processor 1816, the IFO can be identified from l[max(F(l)]×Δf—where l is FFT bin which shows the peak cross-correlation and the Δf is the sub-carrier bandwidth of the bootstrap. In some embodiments, Δf=3000 Hz.

As explained above, according to an example embodiment of the present technique, the up-sampler 1802 is configured to up-sample the frequency domain version of the OFDM symbol by a factor U. Accordingly the cross-correlator 1804 performs a cross correlation between the received OFDM symbol and the signature sequence in the frequency domain with the received OFDM symbol being up-sampled by a factor U so that the cross-correlation becomes as follows:

$$F(Ul+i) = \left\| \sum_{k=0}^{k=N_{ZC}-1} C_1^*(k) R(U(l+k)+i) \right\|$$

Then according to the present technique, the output processor 1816 is configured to detect the IFO and the FFO according to the following expressions:

Let l′=l[max(|F(l)|)] then

IFO=round(l′÷U)×Δf

FFO=(Δf*l′÷U)−IFO

The identified signature sequence for the first OFDM bootstrap symbol C$_1$(k) is then fed to a divider 1830 which receives on a second input 1832 the frequency domain OFDM symbol. By dividing the received signal by the signature sequence for the first bootstrap OFDM symbol an estimate of the channel transfer function H(k) for the first OFDM bootstrap symbol is generated at an output 1834.

Figure 19:
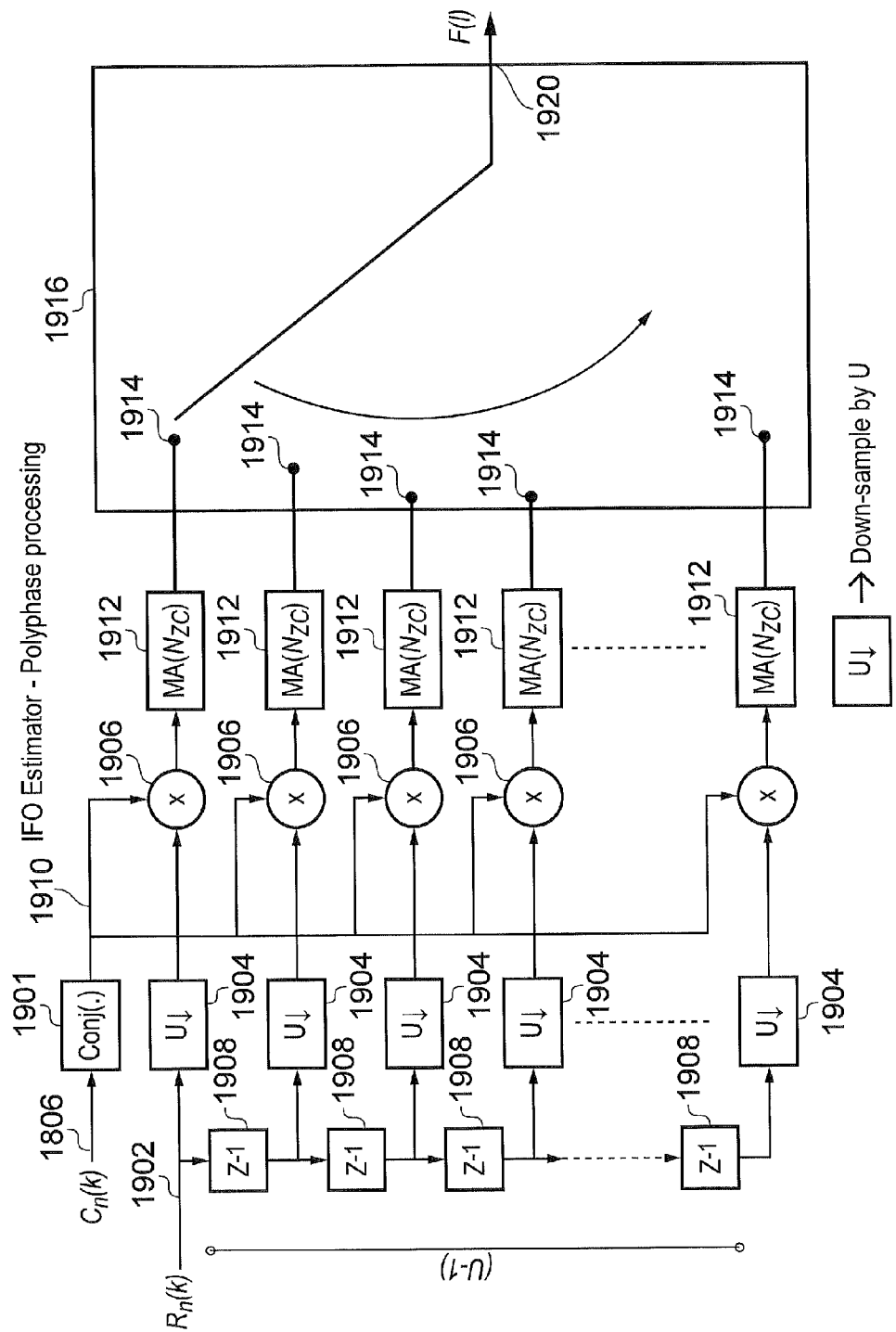
FIG. 19 is a schematic block diagram of a polyphase processor forming part of the first bootstrap processor/decoder showing in FIG. 18.

A more detailed block diagram of the cross correlator 1804 is shown in FIG. 19. As shown in FIG. 19 the signature sequence C$_1$(k) is fed on a first input 1806 to a conjugator 1901. The up-sampled OFDM symbol is fed on an input 1902 to a sequence of down sampling units 1904 which successively extract one sample from every U of the up sampled version of the OFDM symbol which are fed to a first input of a multiplier 1906. The received signal is also fed via a sequence of delay units 1908 to successive down samplers 1904 so that successively each of the samples of the up sampled version of the OFDM symbol are multiplied respectively by different samples of the signature sequence in the base band domain which is fed from the conjugator 1901 on channels 1910. Each of the multipliers feeds its output to a moving averaging filter 1912 of length N$_{ZC}$. Each of the outputs of a moving average filters 1912 are then fed to a terminal 1914 which forms part of the demultiplexer 1916 which selects in turn the output from each of the moving average filters 1912 in order to output the result of the cross-correlator 1804 which forms the input of the peak detector 1814.

Figure 20:
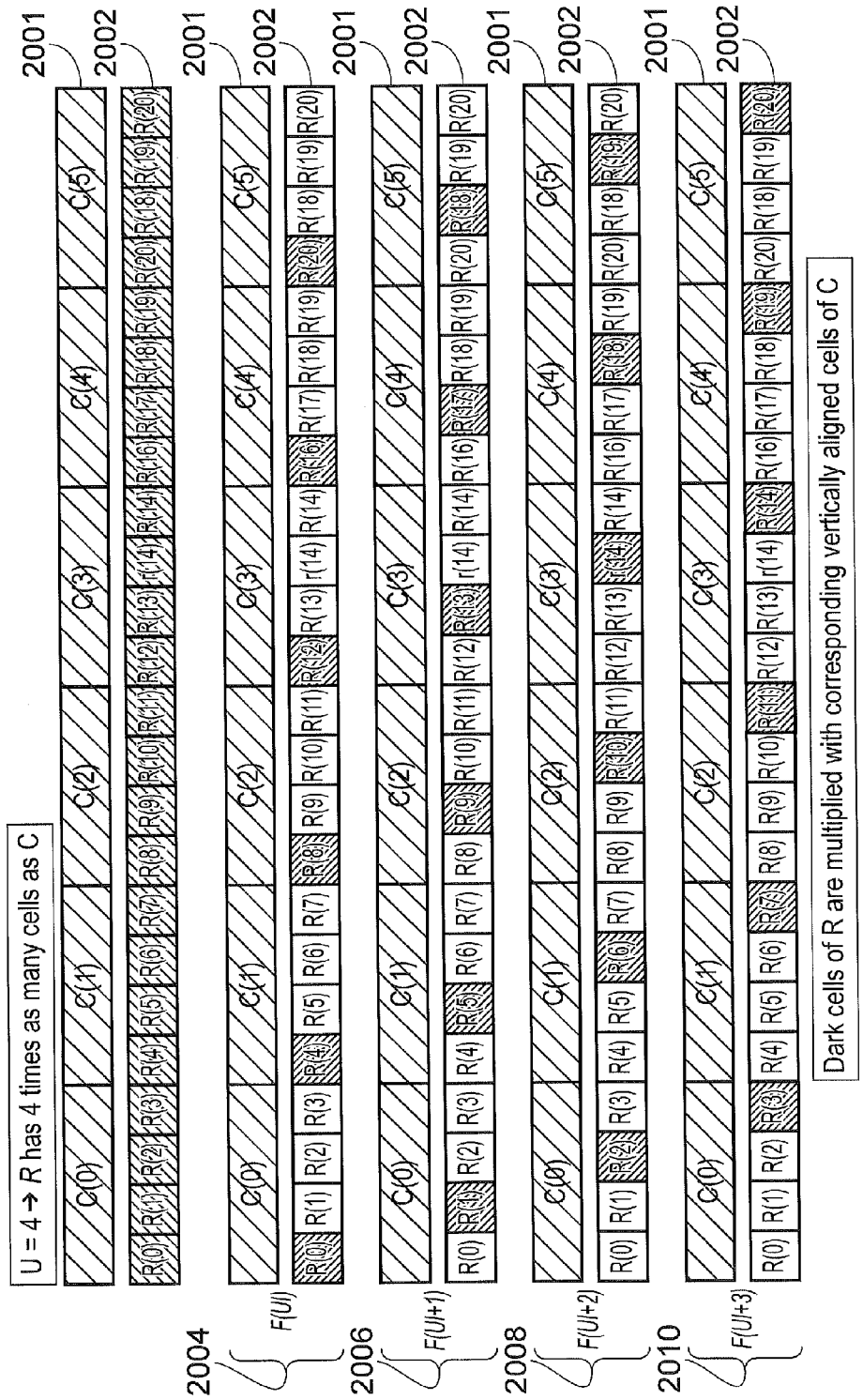
FIG. 20 is a schematic representation of a process of decimating a received signal and multiplying the received signal by the coefficients of a signature sequence in accordance with the present technique.

The cross correlator 1804, which performs the correlation of the up-sampled version of the OFDM symbol with the signature sequence in order to identify the IFO and the FFO from a peak of the correlation is represented pictorially in FIG. 20. A first section 2001 represents the samples of the signature sequence C$_n$(k) in this example only six samples are shown (for k=0 to 5). Correspondingly, the up-sampled version of the received OFDM symbol is shown in section 2002. In this example, the up-sampling facture U is set to 4. As shown in the first row 2004, each of the samples of the signature sequence 2001 are multiplied by one of the samples of the up-sampled version of the received OFDM symbol 2002 for a first literation l=0. Further rows 2006, 2008, 2010 are shown which correspondingly show a next of the up-sampled version of the OFDM symbol being multiplied by the corresponding co-efficient of the signature sequence. Accordingly, in turn, sets of the samples representing the sub-carriers of the OFDM symbol R(Ul) for the over sampled version are successively multiplied by the co-efficients C$_n$(k) of the signature sequence, to identify one of those sets of samples which produces the peak in the correlation result. According to this poly-phase processing of the cross-correlation, the IFO can be identified from a peak of the sub-carrier which produces the highest correlation result and the peak position with respect to the over-sampled sub-carriers identifies the FFO. According to the present technique therefore a more accurate estimate of both the FFO and the IFO is provided.

Figure 21:
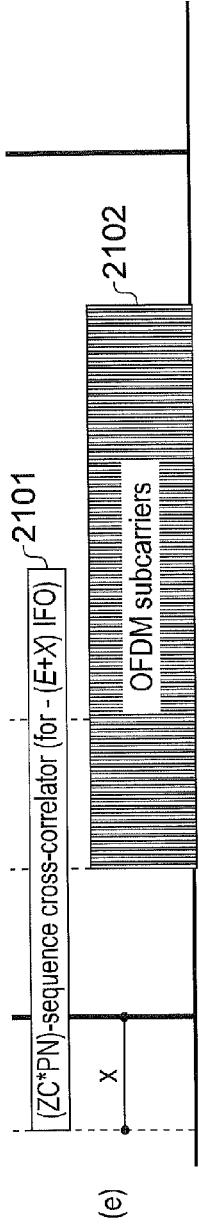
FIGS. 21a and 21b represent a process of correlating a received OFDM symbol in the frequency domain with a reproduced signature sequence performed by the first bootstrap processor/decoder.
Figure 21:
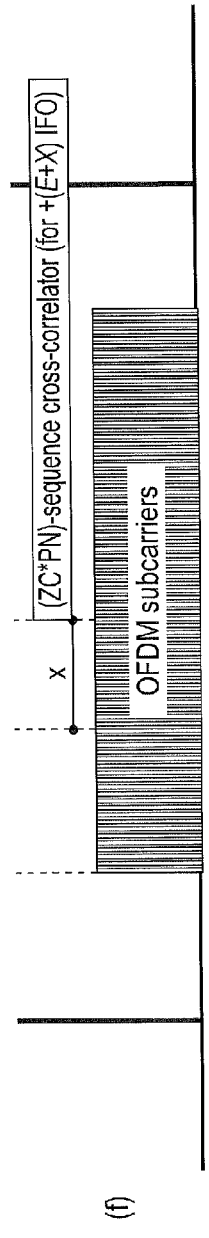

A further example function of the cross-correlator shown in FIGS. 18 and 19 is represented in FIGS. 21a and 21b. In FIGS. 21a and 21b a correlation of the signature sequence 2101 with the OFDM symbol 2102 over a range represented by two extremes shown in FIGS. 21a and 21b is shown for a range which exceed the edge sub-carriers E as explained above. Accordingly, by extending the range of cross correlation the range of IFO that can be estimated also increases. This could allow the use of cheaper oscillators with lower frequency stability in the receiver tuning circuits.

Second Bootstrap OFDM Symbol Processor

Figure 22:
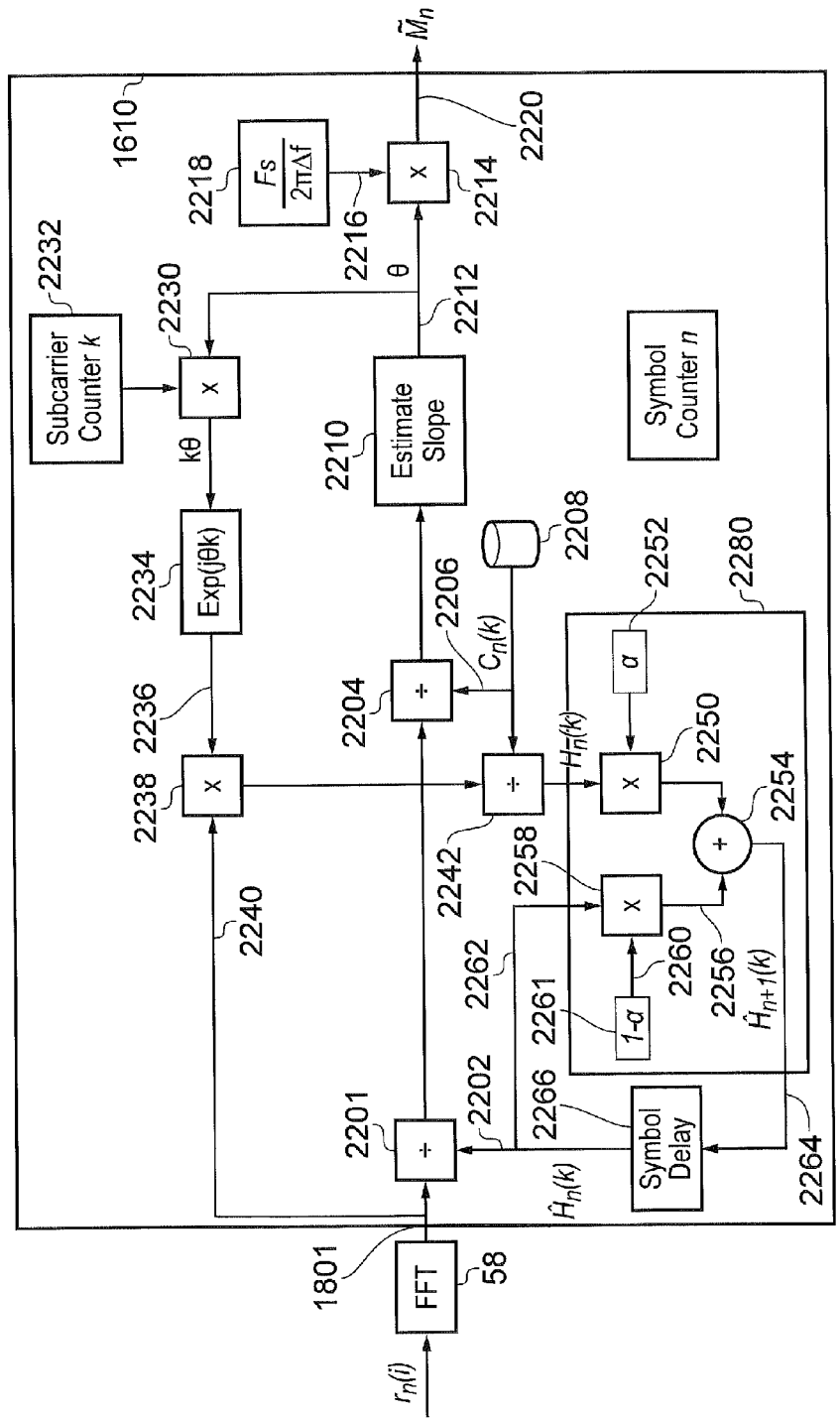
FIG. 22 is a schematic block diagram of a second bootstrap processor/decoder for detecting signalling data carried by other bootstrap symbols other than the first bootstrap OFDM symbol.

An example block diagram of a second bootstrap processor 1610 shown in FIG. 16 will now be described in more detail with reference to FIG. 22. FIG. 22 provides a schematic block diagram of an example embodiment to the present technique which is arranged to generate an estimate of the signalling information, which is represented by a cyclic shift which has been applied to the signature sequence at the transmitter. As shown in FIG. 22 the received signal is fed on channel 1801 in the frequency domain from the output of the FFT processor 58 to a divider 2201. A divider 2201 receives on a second input 2202 an estimate of the channel transfer function H(k), which has been calculated for example by the first bootstrap processor/decoder 1602 as explained above. The divider 2201 divides the received signal R(k) by the estimate of the channel transfer function H(k) which therefore equalises the received OFDM symbol. The received OFDM symbol after equalisation is fed to a second divider 2204 which receives on a second input 2206 the signature sequence $C_n(k)$ corresponding to the n-th OFDM bootstrap symbol, where for the present example n=2, 3 or 4. The equalised received signal is then divided by the signature sequence $C_n(k)$ fed from a data store 2208 through a channel 2206 and the output is fed to a slope estimator 2210. The slope estimator estimates the average change of the phase from sub-carrier to sub-carrier. The slope estimator outputs a phase slope θ with units of radians per sub-carrier through channel 2212. To estimate the shift which has been applied to the signature sequence to represent the signalling information as explained above, this phase slope first has to be converted into units of degree per Hertz. This is done by feeding θ from an output channel 2212 to a multiplier 2214 and multiplied with $-F_s/2\pi\Delta f$ where $F_s$ is the sampling frequency of the bootstrap signal and $\Delta f$ is the sub-carrier bandwidth used for each bootstrap OFDM symbol. In some embodiments, $F_s$=6.144E6 and $\Delta f$=3000. The result of the multiplication is fed from an output of a multiplier 2220 as an estimate of the signalling information, because, as will be explained below, the phase slope represents the cyclic shift applied to the signature sequence at the transmitter.

The phase slope estimate θ from the slope estimator 2210 is then fed to a second multiplier 2230 which also receives an indication of the sub carrier count k. The multiplier 2230 multiplies the phase slope by the sub-carrier number k. The output of multiplier 2230 is a phase which is output into an exponential generator 2234 which uses the input phase to generate a sinusoid. This phase shift is generated for each of the sub-carriers k and fed to a first input 2236 of a third multiplier 2238. On a second input 2240 the frequency domain OFDM symbol is received and multiplied by the phase shift thereby removing the effect of the detected cyclic shift of the signature sequence from the OFDM symbol. The output of the multiplier 2238 is fed to the first input of a divider 2242 which also receives the signature sequence for the n-th bootstrap OFDM symbol $C_n(k)$ from the store 2208 from the connecting channel 2206. The output of the divider 2242 therefore also forms an estimate of the channel transfer function for the n-th bootstrap OFDM symbol $H_n(k)$. The estimate of the channel transfer function is then multiplied using a fourth multiplier 22 by a factor α from a factor unit 2252. The output of the multiplier 2250 is then fed to a first input of an adder 2254 which receives via a second input 2256 an output from a fifth multiplier 2258, which receives on a first input a factor 1−α 2260 and a second input a delayed value of the output of the adder 2264. The output of the adder 2254 forms a combination of the channel transfer function for the current symbol n combined with an estimate of the channel transfer function from the previous symbol n−1 as delayed by a delay unit 2266. Therefore, in combination for each of the received OFDM symbols of the bootstrap symbol, an update of the channel transfer function is performed based on an estimate of the channel transfer function for each successive bootstrap OFDM symbol.

Bootstrap Decoding in the Frequency Domain

According to the present technique an estimate of the cyclic shift of the signature sequence is generated by estimating the phase slope across sub-carriers in the frequency domain that results from the cyclic shift of the signature sequence in the time domain by the slope estimator 2210. This arrangement is shown in isolation in FIG. 23 in order to provide a more thorough explanation and so parts appearing in FIG. 23 have the same numerical designations as in FIG. 22.

As explained above, the transmitter applies a cyclic shift of m-samples to the signature sequence, so that $$r_n(i) \xrightarrow{yields} r_n(i-m).$$

by me cyclic shift property of the FFT:

$$FFT(r_n(i-m)) = e^{-j2\pi mk/N} R_n(k), \text{where } R_n(k) = FFT(r_n(i))$$

The component $e^{-j2\pi mk/N}$ can be used to estimate the cyclic shift representing the signal information $\tilde{M}_n$ for the bootstrap symbols $BS_{[n]}$ where n=2, 3, 4. Therefore by executing an FFT on the useful part of the bootstrap OFDM symbol $r_n$ (i) $R_n$ (k) is obtained. Then perform a zero-forcing equalisation on $R_n$ (k) using $\hat{H}_n(k)$ to obtain $R_n'(k)$ according to:

$$R_n'(k) = R_n(k) \div \hat{H}_n(k)$$

Figure 23:
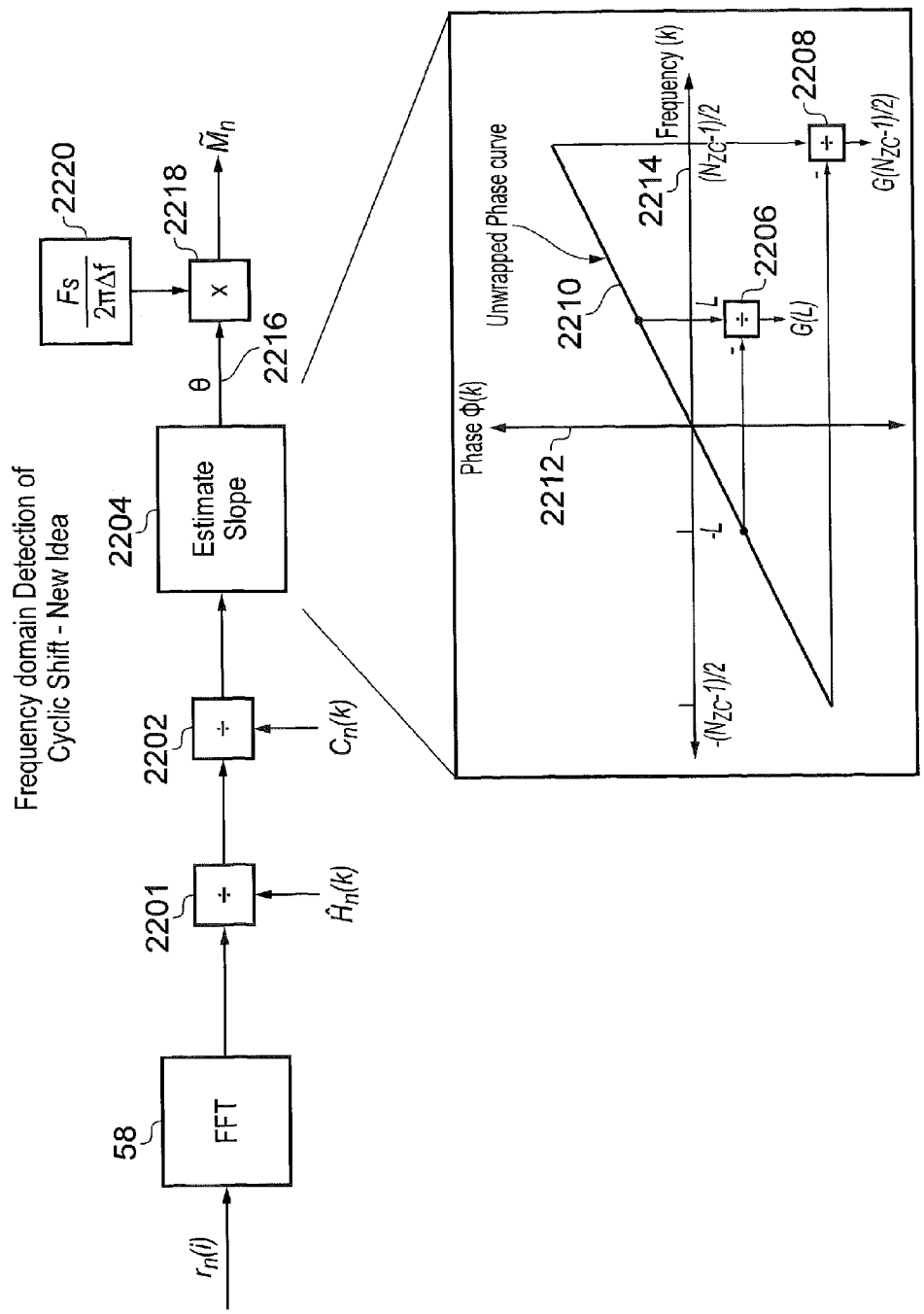
FIG. 23 is a schematic block diagram of parts of the second bootstrap processor/decoder illustrated in FIG. 22 which is configured to estimate the cyclic shift of a signature sequence carried by the bootstrap symbol to detect signalling data in accordance with the present technique.

As shown in FIG. 23, the FFT processor 58 feeds the frequency domain OFDM symbol to the first divider 2201 which equalises the received signal by dividing the received symbol in the frequency domain R(k) by the current estimate of the channel transfer function $\hat{H}_n(k)$. A second divider 2202 then divides the equalised received symbol from the output of the first divider 2201 by the signature sequence for the n-th symbol $C_n(k)$ to isolate a frequency shift on each of the sub-carriers of the OFDM symbol which is produced as a result of a cyclic shift applied to the signature sequence at the transmitter. The effect of the signature sequence in the frequency domain is then removed to obtain $R_n''(k)$ according to the expression:

$$R_n''(k) = R_n'(k) \div C_n(k)$$

The phase component of $R_n''(k)$ is then measured as $\varphi(k)=\text{Arg}(R_n''(k))$. This argument is calculated for $k=(-N_{ZC}-1)/2$ to $(N_{ZC}-1)/2$, so that $$\theta = \frac{2}{N_{ZC}-1} \sum_{k=1}^{k=(N_{ZC}-1)/2} \frac{(\phi(k)-\phi(-k))}{2k}$$

As shown in FIG. 23, a phase slope estimator 2204 performs a function of unwrapping a phase curve so that addition elements 2206, 2208 can detect a slope of the function line 2210 of phase 2212 against frequency 2214. The phase slope estimator 2204 therefore measures the slope on Q (k)=Arg $(R_n''(k))$ across all subcarriers to determine $\theta$ rads per FFT bin. The output of the phase slope estimator 2204 then produces a phase value $\theta$ on a channel 2216 which is fed to a multiplier 2218.

The cyclic shift is then determined as:

$$\tilde{M}_n = -\frac{\theta}{2\pi\Delta f} * F_S$$

where $\Delta f$ is the subcarrier bandwidth, for example 3000 Hz and $F_S$ is the baseband sampling frequency of the bootstrap signal for example 6.144 MHz. As such, the multiplier 2218 also receives a number representing $$\left(-\frac{F_S}{2\pi\Delta f}\right)$$

which when multiplied by the phase slope produces an indication of the cyclic shift and therefore the signalling information which was conveyed by the bootstrap OFDM symbol at the transmitter. Accordingly, FIGS. 22 and 23 provide an example in which the bootstrap processor/decoder 1610 shown in FIG. 16, which detects the signalling information conveyed with the bootstrap symbol in the frequency domain.

Figure 24:
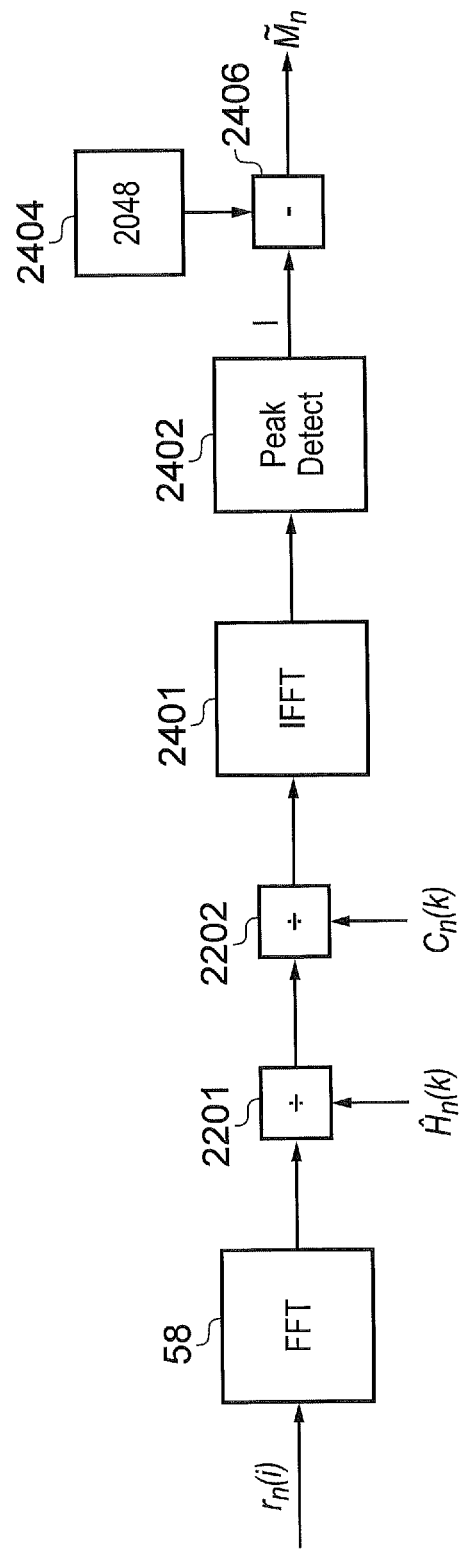
FIG. 24 is a schematic representation of a process of correlating the signature sequence with a received signal using decimation in accordance with the present technique.

In another embodiment, as shown in FIG. 24, the output of the divider 2202 is transformed back into the time domain using an inverse FFT 2401 and the cyclic shift is detected by the peak detector 2402, from the sample number of the peak sample in the transform result. The signalling information $\tilde{M}_n$ is then detected by subtracting a total number of samples 2048 from sample number of the peak, using a subtraction circuit 2406. According to the example embodiment shown in FIG. 24, a more robust technique for estimating the cyclic shift is provided, which does not require the estimation of the phase slope. The phase slope method can be highly sensitive to noise and also requires resolution of a phase slope ambiguity when the cyclic shift is exactly 1024.

Channel Transfer Function Update

As explained above with reference to FIG. 22 the bootstrap processor for detecting the signalling information according to the present technique includes an arrangement for tracking changes in the channel transfer function $\hat{H}_n(k)$ between OFDM symbols of the bootstrap signal. In particular, elements which fall within the box 2280 shown in FIG. 22 provide a "leaky bucket" arrangement for adapting the channel transfer function which is used to equalise the next OFDM symbol with respect to an estimated version of the channel transfer function for the current OFDM symbol. This is because the first estimate of the channel transfer function $\hat{H}_1(k)$, which is generated from the first bootstrap OFDM symbol ($BS_1$) may have changed for subsequently transmitted OFDM symbols of the bootstrap signal ($BS_{[n]}$, where n=2, 3 4), particularly for fast moving channels. According to the present technique therefore, the channel transfer function $\hat{H}_n(k)$ which is used to equalise the n-th bootstrap symbol is updated for each bootstrap symbol. In particular, units $\alpha$ 2252 and 1-$\alpha$ 2261 have an effect of scaling each of the coefficients of the channel transfer function for the estimated version of the current symbol with respect to the estimated version for the previous symbol which are then combined by the added 2254 to form an estimate of the channel transfer function for the next OFDM symbol. As such following the delay 2266, the estimated channel transfer function for the next OFDM symbol is derived from a combination of the channel transfer function for the current OFDM symbol and the estimated channel transfer function for the previous symbol. The following paragraphs provide a more detailed explanation of the operations of the bootstrap processor to update the channel transfer function and equalise the received signal:

First the cyclic shift on the n-th symbol is determined $r_n(i)$, and this is used to remove the effect of the cyclic shift to form $r_n'(i)$ by reversing the shift. The reversal of the phase shift can be done in the time domain or in the frequency domain. For the time domain removal of the cyclic shift, the samples of the time domain symbol are simply shifted cyclically by a number of cycles equal to the cyclic shift to be removed. The adapted received symbol $r_n'$ (i) is then transformed into the frequency domain according to the expression:

$$R_n'(k)=\text{FFT}(r_n'(i))$$

For the frequency domain removal of the channel transfer function, the received bootstrap OFDM symbol is first transformed into the frequency domain according to the expression:

$$R_n(k)=\text{FFT}(r_n(i))$$

Since the cyclic shift is estimated in the frequency domain as a phase slope $\theta$, the phase slope can then be removed in the frequency domain according to:

$$R_n'(k)=R_n(k)e^{jk\theta}$$

The channel transfer function for the currently received n-th OFDM symbol is then determined as $$H_n(k)R_n'(k)/C_n(k) \text{ where } n=2,3,4$$

Then the channel transfer function for the next bootstrap OFDM symbol (n+1) is determined according to:

$$\hat{H}_{n+1}(k)=\alpha H_n(k)+(1-\alpha)H_{n-1}(k)$$

Therefore following a delay of one symbol the updated channel transfer function is used for the current symbol as $\hat{H}_n(k)$. The factor $\alpha$ can be decided experimentally, for example ⅔.

Bootstrap Decoding in the Time Domain

In contrast to FIGS. 22, 23 and 24 which show the bootstrap decoder operating to detect the signalling information from the shift in the signature sequence in the frequency domain, FIG. 15 provides an example in which the bootstrap decoding is performed in the time domain. That is the shift of the signature sequence carried by the OFDM symbol is detected in the time domain. According to the arrangement shown in FIG. 15 the look up table/signature sequence generator 1534 provides the signature sequence on channel 1536 to the multiplier 1530 which is multiplied by the estimate of the channel transfer function $\hat{H}_n(k)$ by the multiplier 1530. This forms effectively a channel shaping of the signature sequence. The shaped signature sequence is then transformed from the frequency domain to the time domain as it appears at the output of the Inverse Fast Fourier Transform (IFFT) processor 1540 on channel 1542. The isolated useful part of the received OFDM symbol is then fed from channel 1522 to a relative cyclic shift estimation circuit. The relative cyclic shift estimation circuit 1524 performs a time domain correlation of the received signal with the channel shaped time domain signature sequence in order to detect the cyclic shift of the signature sequence and therefore the signalling data $M_n$. This operation is expressed mathematically as follows:

According to the present technique the time domain estimate of the relative shift of the signature sequence $\tilde{c}_n(i)$ is determined for the n-th bootstrap symbol by first channel shaping the signature sequence, by multiplying the sequence in the frequency domain by the estimate of the channel transfer function for the n-th symbol according to:

$$\tilde{C}_n(k) = C_n(k)\hat{H}_n(k)$$

Then the resulting sequence is transformed into the time domain by performing an inverse Fourier Transform according to:

$$\tilde{c}_n(i) = \text{IFFT}(\tilde{C}_n(k))$$

The useful part of the received signal is then isolated by the B–C remover 1520 so that the part $r_n(i)$ for the n-th bootstrap OFDM symbol is then correlated with the channel shaped time domain signature sequence according to the expression:

$$g_n(l) = \Sigma_{i=0}^{i-N_{FFT}-1} \tilde{c}_n(i) r_n(\text{mod}(i+1, N_{FFT}))$$
for $l = 0, 1, \ldots, N_{FFT}$ As a result of the structure of the signature sequence the correlation is circular so that $r_n(i) = r_n(i \bmod N_{FFT})$, where for example $N_{FFT} = 2048$. Accordingly, the correlation requires $N_{FFT}*N_{FFT}$ complex multiplies and $N_{FFT}*N_{FFT}$ complex adds. The relative cyclic shift is then determined in the time domain as:

$$\tilde{M}_n = l[\max(|g_n(l)|)]$$

The absolute cyclic shift is then decoded as:

$$M_n = \text{mod}(M_{n-1} - \tilde{M}_n, N_{FFT}), \text{ with } M_1 = 0$$

According to an example embodiment of the present technique the relative cyclic shift maybe estimated in the time domain by using a technique, which decimates the signature sequence in order to reduce the complexity of the cyclic shift estimator.

Figure 25:
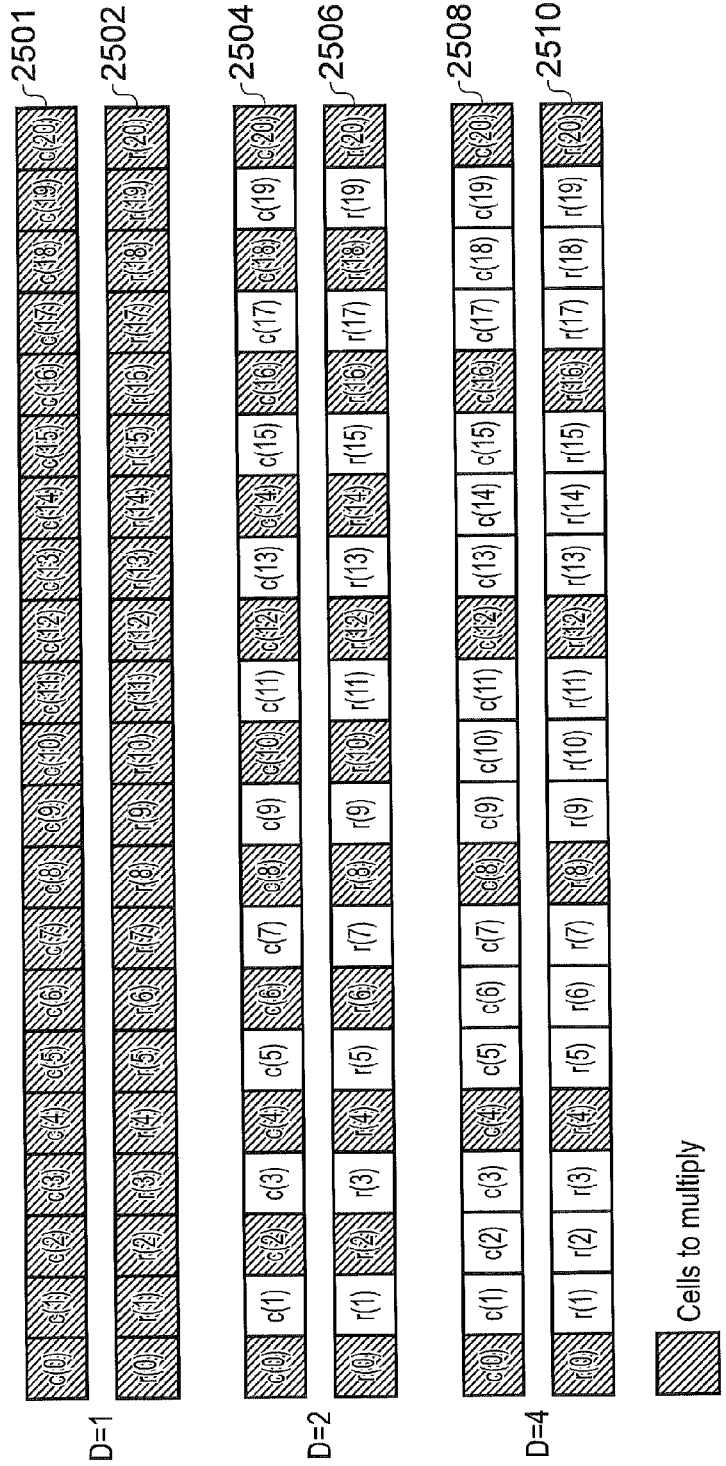
FIG. 25 is a schematic block diagram of an alternative embodiment for the second bootstrap processor/decoder illustrated in FIGS. 22 and 23 in which the signalling data is detected from an estimate of the cyclic shift applied to the signature sequence.

According to the present technique the samples of the received signal and the channel shaped signature sequence in the time domain can be decimated in order to reduce a complexity with which the estimation of the cyclic shift is determined. FIG. 25 provides an example illustration of a decimation performed to generate the cyclic shift estimation in the time domain. As shown in FIG. 25 a first line of cells represents 21 samples of the channel shaped signature sequence in the time domain whereas line 2502 represents the 21 samples of the received signal in the time domain. For the first lines 2501, 2502 a cyclic shift estimation maybe formed by multiplying each of the samples together in order to determine the cyclic shift as a cross correlation sample. However, it is possible to estimate the cyclic shift by decimating both the samples of the channel shaped signature sequence and the received signal 2501, 2502. Third and fourth lines shown in FIG. 2504, 2506 show some elements, which are shaded and some which are clear. The elements which are shaded are used in the multiplication to perform the cross correlation to estimate the cyclic shift and those with a clear or white filling are not used. Accordingly, the lines 2504, 2506 represent a decimation of d=2 that is, every other sample is used in the generation of the cyclic shift estimation. Fifth and sixth lines 2508, 2510 provide a further example in which the decimation value d=4. That is to say, only one in four of the samples of the signature sequence 2508 and the received signal 2510 are used to calculate the cross correlation between the channel shaped signature sequence and the received signal in the time domain and therefore estimate the signalling information carried by the bootstrap OFDM symbol. Accordingly, only one in four of the cells in each of the received signal and the channel shaped signature sequence are shaded. This decimation and simplification can be expressed according to the above equations as follows:

$$g_n(l) = \Sigma_{i=0}^{i-N_{FFT}-1} \tilde{c}_n(i) r_n(\text{mod}(i+1, N_{FFT}))$$

According to this arrangement, the correlation requires $N_{FFT}*N_{FFT} \div D$ complex multiplies and $N_{FFT}*N_{FFT} \div D$ complex adds. As such for an example in which the decimation factor D=8, then each iteration l now requires only $$\frac{N_{FFT}}{8} = 256$$

complex mummy and add operations.

According to the present technique therefore, determining the cyclic shift of the signature sequence carried by the received OFDM symbols of the bootstrap signal in the time domain can be provided with a reduced complexity and therefore an improved performance of the receiver. For example decimation techniques can be used to reduce the complexity of calculating the cross-correlation.

Summary of Operation

Figure 26:
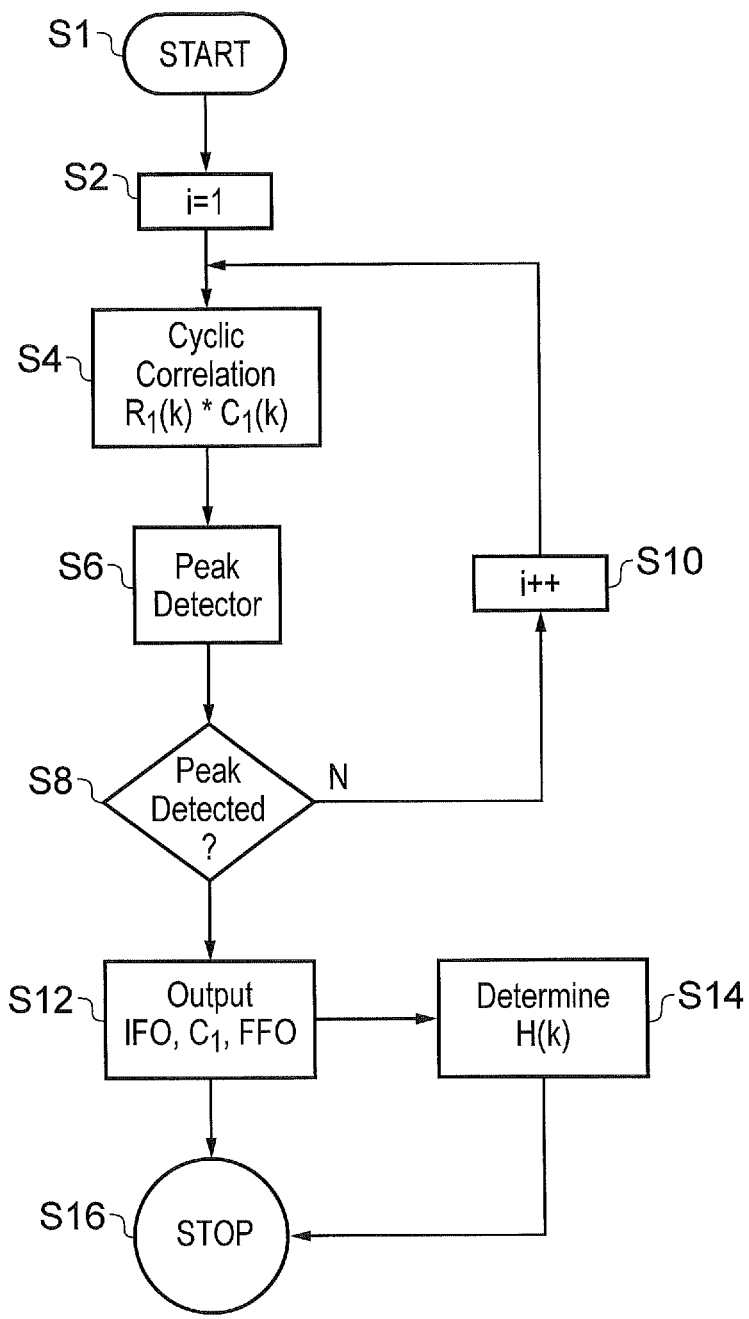
FIG. 26 is an illustrative flow diagram representing an operation of a first bootstrap processor in accordance with the present technique.
Figure 27:
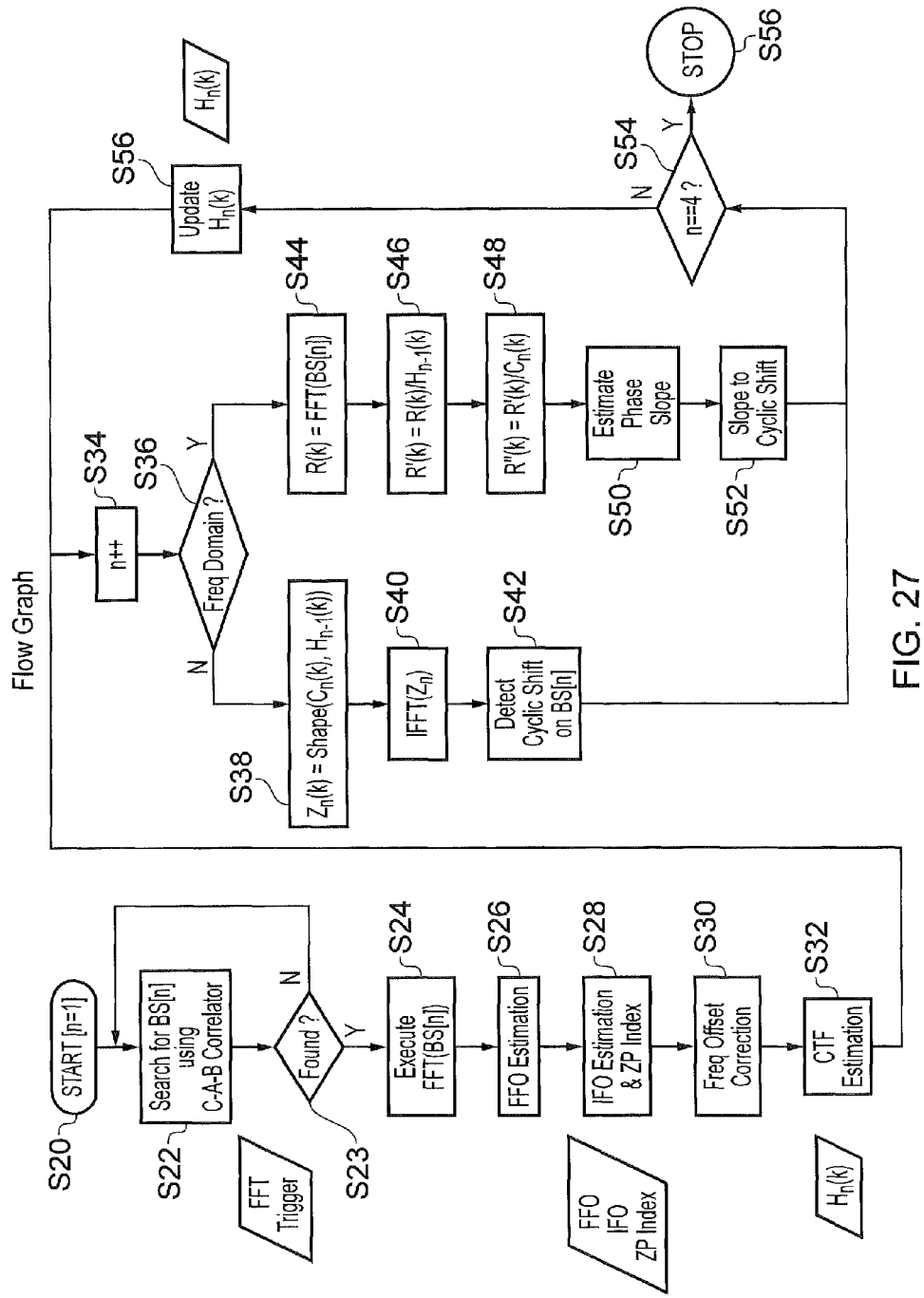
FIG. 27 is a representative flow diagram illustrating a method of operation of a second bootstrap processor in accordance with the present technique.

In summary a receiver configured to detect a bootstrap signal in accordance with the present technique performs the operations as represented in FIGS. 26 and 27. FIG. 26 represents the operation of the bootstrap processor for the first and subsequent bootstrap symbols whereas FIG. 27 represents the operations performed for the first bootstrap processor for detecting the signature sequence, integer and fine frequency offsets and the initial channel transfer function.

The following diagram shown in FIG. 26 is therefore summarised as follows:

S1: At the start of the process the received symbol is in the frequency domain as shown in FIG. 16. In some embodiments, the symbol spectrum may be oversampled having been derived from an FFT of larger than 2048 spectral output components.

S2: At the start of the loop the reference signature sequence index variable is initialised as i=1.

S4: A cyclic correlation is therefore performed between the received frequency domain OFDM symbol and the i-th signature sequence.

S6 and S8: A significant peak value will be detected in the output of the cross correlation within the range of IFO if the reference signature sequence i is the same as the one used at the transmitter. If significant peak value has not been detected then processing proceeds to step S10 and the reference signature sequence index variable i increased and the next reference signature sequence is tried in the cross-correlation. The candidate reference signature sequences may be pre-stored in the receiver with the indexing based a combination of the root of the Zadoff-Chu and the seed of the PN generator used to generate the particular sequence.

S12: If a significant peak of the cross-correlation has been detected, then the current value of i is the index to the wanted reference signature sequence; the relative position of the peak in the corss-correlation output is used to determine the Integer Frequency Offset (IFO) and the Fine Frequency Offset (FFO) if the spectrum was over-sampled.

S14: At step S14 the received signal is divided by the detected signature sequence to generate an estimate of the channel transfer function H(k). At step S16 the process ends.

The flow diagram shown in FIG. 27 which represents the operation for all the bootstrap symbols is summarised as follows:

S20: At the start of the process the value n for the bootstrap symbol which can be two, three or four is set to one.

S22, S23: CAB correlation is used to detect the presence of the first bootstrap symbol. The CAB correlator is run continuously until a significant peak is detected at its output (S23). The occurrence of the peak is used to trigger the FFT that converts this first OFDM symbol into the frequency domain (S24) whilst the argument of the peak sample is used to estimate the fine frequency offset (FFO) in step S26.

S28: This step is the process described above in FIG. 25. The Integer Frequency Offset (IFO) estimation, and the signature sequence index is then determined. If spectrum over-sampling was used, a more refined FFO may also be estimated.

S30: With knowledge of both the IFO and the FFO, the combined frequency offset is then removed from the received signal and the channel transfer function estimated in step S32 by dividing the received signal from which the frequency offset has been removed by the reference signature sequence identified in step S28.

Processing then proceeds with an increase in the variable n because the next bootstrap symbol is being processed. At step 34 therefore the value of n is incremented. The next steps depend on whether the receiver is designed to detect the cyclic shifts of the signature sequence in the subsequently received bootstrap symbols in the time domain or the frequency domain. If in the time domain, then processing will proceed to S38 otherwise, the next step is S44

S38: In the time domain the signature sequence is first shaped by the channel transfer function estimated in step S32 and then converted into the time domain using an Inverse Fast Fourier Transform performed at step S40. At step S42 a cross correlation of the channel shaped time domain signature sequence is performed with the received symbol in order to detect the cyclic shift and therefore the signalling information carried by the OFDM symbol.

S44: In contrast if processing is performed in the frequency domain then the received signal is transformed into the frequency domain at step S44 and at step S46 the frequency domain symbol is equalised by dividing the symbol by the estimate of the channel transfer function.

S48: The equalised signal is then divided by the frequency domain version of the signature sequence and an estimate is performed of a slope of the resulting phase shift across the OFDM sub-carriers at step S50. At step S52 the slope of the change of phase with respect to sub-carrier is then determined and used to calculate the cyclic shift representing the information carried by the bootstrap symbol. At step S54 it is determined whether the last OFDM symbol has been received. If it is the last OFDM symbol of the bootstrap signal then processing stops at step S56 otherwise the channel transfer function is updated in step S56 as explained above and processing proceeds again to determine the cyclic shift of the signature sequence in the next bootstrap symbol in order to detect and decode the signalling information.

Accordingly embodiments of the present technique can provide an arrangement for improving an accuracy with which the timing of the FFT trigger point for capturing a useful part of the OFDM symbol of the bootstrap signal is estimated. Correspondingly an estimate of the FFO is also improved. This is achieved by arranging for each of a plurality of correlators each of which is adapted to match the time domain structure of the different types of bootstrap OFDM symbols. By respectively delaying each of the correlation results from the respective correlators in accordance with a relative delay in transmission of a useful section of each of the OFDM symbols, the correlation results can be combined to produce a more accurate estimate of the FFT trigger point and the FFO.

The following numbered paragraphs define further example aspects and features of the present technique:

Paragraph 1. A receiver for detecting and recovering payload data from a received signal, the receiver comprising a radio frequency demodulation circuit configured to detect the received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols, a detector circuit configured to detect, from one or more of the bootstrap OFDM symbols, a synchronisation timing for converting a useful part of the bootstrap OFDM symbols into the frequency domain, a bootstrap processor configured to detect, which of a plurality of signature sequences was used in the bootstrap symbol and using the detected signature sequence, to detect a frequency offset of the received signal and to estimate a channel transfer function from the first bootstrap OFDM symbol, and a demodulator circuit configured to recover the signalling data from the one or more bootstrap OFDM symbols using the estimate of the channel transfer function, wherein the bootstrap processor comprises an up-sampler configured to form an up-sampled frequency domain version of the bootstrap OFDM symbol using the identified synchronisation timing, the up-sampled version comprising for each sub-carrier of the first bootstrap OFDM symbol a plurality of U samples representing each of the sub-carriers of the bootstrap OFDM symbol, a cross-correlator configured to cross-correlate in turn each of a set of signature sequences, each of which may have been combined with the first bootstrap OFDM symbol at the transmitter, with the up-sampled version of the first bootstrap OFDM symbol to generate for each of the set of signature sequences and for each of the sub-carriers of the up-sampled version of the OFDM symbol a correlation result, and an output processor configured to identify a peak correlation result generated by the cross-correlator, and to determine from the set to which the peak sample belongs, the signature sequence that was used at the transmitter for the bootstrap and the frequency offset of the received signal from a relative position of the peak correlation result in the frequency domain in accordance with a sub-carrier bandwidth of the up-sampled version of the bootstrap OFDM symbol.

Paragraph 2. A receiver according to paragraph 1, wherein the frequency offset includes an integer frequency offset, IFO, representing a displacement in frequency of the received signal equivalent to an integer number of sub-carriers of the bootstrap OFDM symbol, and the bootstrap processor is configured to determine the IFO by multiplying a bandwidth of the sub-carrier of the bootstrap OFDM symbol with the relative position of the peak correlation result divided by the up-sampling factor U.

Paragraph 3. A receiver according to paragraph 1 or 2, wherein the frequency offset includes a Fine Frequency Offset, FFO, and the bootstrap processor is configured to determine the FFO by subtracting from the frequency offset the IFO multiplied by the bandwidth of the sub-carrier of the bootstrap OFDM symbol.

Paragraph 4. A receiver according to paragraph 1, 2 or 3, wherein the coefficients of the signature sequence are symmetrical about a central point of the signature sequence and the cross-correlator is configured to generate the correlation result using half of the number of multiplications in proportion to a length of the signature sequence.

Paragraph 5. A receiver according to any of paragraphs 1 to 4, wherein the cross-correlator is configured to decimate the signature sequence to select one from every d samples of the coefficients of the signature sequence for generating the correlation result to reduce the number of multiplications and additions.

Paragraph 6. A receiver according to any of paragraphs 1 to 4, comprising a combiner configured to receive a representation of the WO and the FFO and to combine the IFO and the FFO to form a total frequency offset, a tone generator which receives the total frequency offset and generates a tone whose frequency is equal to the negative of the total frequency offset, and a mixer which multiplies the received signal with the tone to remove the total frequency offset from the received signal.

Paragraph 7. A receiver according to any of paragraphs 1 to 6, wherein the bootstrap processor is configured to divide the first bootstrap OFDM symbol in the frequency domain by the detected signature sequence to generate an estimate of the channel transfer function for use in equalising one or more other bootstrap OFDM symbols.

Paragraph 8. A receiver according to any of paragraphs 1 to 7, wherein the signature sequence includes a plurality of edge sub-carriers at either end of the signature sequence, which do not carry data, and the correlator is configured to perform the cross-correlation, which extends beyond the plurality of edge subcarriers.

Paragraph 9. A receiver according to any of paragraphs 1 to 8, wherein the up-sampler is configured to form the up-sampled frequency domain version of the bootstrap OFDM symbol, by identifying samples of the bootstrap symbol in the time domain using the synchronisation timing, appending a plurality of zero valued samples to the samples of the bootstrap OFDM symbol, and performing a forward Fourier transform to convert the bootstrap OFDM symbol with the appended zero valued samples into the frequency domain, the number of zero valued samples being (U−1) time the number of samples of the bootstrap OFDM symbol in the time domain.

Paragraph 10. A method of detecting and recovering payload data from a received signal, the method comprising detecting the received signal, the received signal having been formed and transmitted by a transmitter to early the payload data as Orthogonal Frequency Division Multiplexed (OFDM) symbols in one or more of a plurality of time divided frames, each frame including a preamble including a plurality of bootstrap OFDM symbols, detecting, from one or more of the bootstrap OFDM symbols, a synchronisation timing for converting a temporal length of a useful part of the bootstrap OFDM symbols into the frequency domain, detecting which of a plurality of signature sequences was used in the bootstrap symbol and detecting, using the detected signature sequence, a frequency offset of the received signal and estimating a channel transfer function from the first of the bootstrap OFDM symbols, and recovering the signalling data from the one or more bootstrap OFDM symbols using the estimate of the channel transfer function determined, wherein the detecting, using the signature sequence, a frequency offset of the received signal comprises forming an up-sampled frequency domain version of the bootstrap OFDM symbol, the up-sampled frequency domain version comprising for each sub-carrier of the first bootstrap OFDM symbol a plurality of U samples representing each of the sub-carriers of the bootstrap OFDM symbol, cross-correlating a signature sequence, which was combined with the first bootstrap OFDM symbol at the transmitter, with the up-sampled version of the first bootstrap OFDM symbol to generate for each of the sub-carriers of the up-sampled version of the OFDM symbol a correlation result, and identifying a peak correlation result, and determining the frequency offset of the received signal from a relative position of the peak correlation result in the frequency domain in accordance with a sub-carrier bandwidth of the up-sampled version of the bootstrap OFDM symbol.

Paragraph 11. A method according to paragraph 10, wherein the frequency offset includes an integer frequency offset, IFO, representing a displacement in frequency of the received signal equivalent to an integer number of sub-carriers of the bootstrap OFDM symbol, and the detecting, using the signature sequence, a frequency offset of the received signal comprises determining the IFO by multiplying a bandwidth of the sub-carrier of the bootstrap OFDM symbol with the relative position of the peak correlation result divided by the up-sampling factor U.

Paragraph 12. A method according to paragraph 10 or 11, wherein the frequency offset includes a Fine Frequency Offset, FFO, and the detecting, using the signature sequence, a frequency offset of the received signal includes determining the FFO by subtracting from the frequency offset the IFO multiplied by the bandwidth of the sub-carrier of the bootstrap OFDM symbol.

Paragraph 13. A method according to paragraph 10, 11 or 12, wherein the coefficients of the signature sequence are symmetrical about a central point of the signature sequence and the cross-correlating the signature sequence with the up-sampled version of the first bootstrap OFDM symbol to generate the correlation result comprises generating the correlation result using half of the number of multiplications in proportion to a length of the signature sequence.

Paragraph 14. A method according to any of paragraphs 10 to 13, wherein the cross-correlating the signature sequence with the up-sampled version of the first bootstrap OFDM symbol to generate the correlation result samples comprises decimating the signature sequence to select one from every d samples of the coefficients of the signature sequence to calculate the correlation result samples to reduce the number of multiplications and additions.

Paragraph 15. A method according to any of paragraphs 10 to 14, comprising receiving a representation of the IFO and the FFO and to combine the IFO and the FFO to form a total frequency offset, generating, from the total frequency offset, a tone whose frequency is equal to the negative of the total frequency offset, and multiplying the received signal with tone to remove the total frequency offset from the received signal.

Paragraph 16. A method according to any of paragraphs 10 to 15, comprising dividing the first bootstrap OFDM symbol by the detected signature sequence in the frequency domain to generate an estimate of the channel transfer function for use in equalising one or more other bootstrap OFDM symbols.

Paragraph 17. A method according to any of paragraphs 10 to 16, wherein the forming the up-sampled frequency domain version of the bootstrap OFDM symbol, comprises identifying samples of the bootstrap symbol in the time domain using the synchronisation timing, appending a plurality of zero valued samples to the samples of the bootstrap OFDM symbol, and performing a forward Fourier transform to convert the bootstrap OFDM symbol with the appended zero valued samples into the frequency domain, the number of zero valued samples being (U−1) time the number of samples of the bootstrap OFDM symbol in the time domain.

Various further aspects and features of the present technique are defined in the appended claims and various combinations of the features of the dependent claims may be made with those of the independent claims other than the specific combinations recited for the claim dependency. Modifications may also be made to the embodiments hereinbefore described without departing from the scope of the present technique. For instance, processing elements of embodiments may be implemented in hardware, software, and logical or analogue circuitry. Furthermore, although a feature may appear to be described in connection with particular embodiments, one skilled in the art would recognise that various features of the described embodiments may be combined in accordance with the present technique.

[1] ATSC Candidate Standard: System Discovery and Signaling (Doc. A/321 Part 1), Document S32-231r4, 6 May 2015

[2] EN 302 755 V1.3.1, Frame structure channel coding and modulation for a second generation digital terrestrial television broadcasting system (DVB-T2), April 2012

The invention claimed is:

1. A receiver for detecting and recovering payload data from a received signal, the receiver comprising:

a radio frequency demodulation circuit configured to detect the received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols, a detector circuit configured to detect, from one or more of the bootstrap OFDM symbols, a synchronisation timing for converting a useful part of the bootstrap OFDM symbols into the frequency domain, a bootstrap processor configured to detect, which of a plurality of signature sequences was used in a first bootstrap OFDM symbol of the one or more bootstrap symbols and using the detected signature sequence, to detect a frequency offset of the received signal and to estimate a channel transfer function from the first bootstrap OFDM symbol, and a demodulator circuit configured to recover signalling data from the one or more bootstrap OFDM symbols using the estimate of the channel transfer function, wherein the bootstrap processor comprises an up-sampler configured to form an up-sampled frequency domain version of the first bootstrap OFDM symbol using the identified synchronisation timing, the up-sampled version comprising for each sub-carrier of the first bootstrap OFDM symbol a plurality of samples representing each of the sub-carriers of the first bootstrap OFDM symbol, a cross-correlator configured to cross-correlate in turn each of a set of the signature sequences, each of which have been combined with the first bootstrap OFDM symbol at the transmitter, with the up-sampled version of the first bootstrap OFDM symbol to generate for each of the set of signature sequences and for each of the sub-carriers of the up-sampled version of the OFDM symbol a correlation result, and an output processor configured to identify a peak correlation result generated by the cross-correlator, and determine from the set to which the peak sample belongs to, the signature sequence that was used at the transmitter for the bootstrap and the frequency offset of the received signal from a relative position of the peak correlation result in the frequency domain in accordance with a sub-carrier bandwidth of the up-sampled version of the first bootstrap OFDM symbol.

2. The receiver as claimed in claim 1, wherein the frequency offset includes an integer frequency offset, IFO, representing a displacement in frequency of the received signal equivalent to an integer number of sub-carriers of the first bootstrap OFDM symbol, and the bootstrap processor is configured to determine the IFO by multiplying a bandwidth of the sub-carrier of the first bootstrap OFDM symbol with the relative position of the peak correlation result divided by an up-sampling factor.

3. The receiver as claimed in claim 1, wherein the frequency offset includes a Fine Frequency Offset, FFO, and the bootstrap processor is configured to determine the FFO by subtracting from the frequency offset the IFO multiplied by the bandwidth of the sub-carrier of the first bootstrap OFDM symbol.

4. The receiver as claimed in claim 1, wherein the coefficients of the signature sequence are symmetrical around a central point of the signature sequence and the cross-correlator is configured to generate the correlation result using half of the number of multiplications in proportion to a length of the signature sequence.

5. The receiver as claimed in claim 1, wherein the cross-correlator is configured to decimate the signature sequence to select one from every predetermined number of samples of the coefficients of the signature sequence for generating the correlation result to reduce the number of multiplications and additions.

6. The receiver as claimed in claim 1 comprising a combiner configured to receive a representation of the IFO and the FF0 and to combine the IFO and the FFO to form a total frequency offset, a tone generator which receives the total frequency offset and generates a tone whose frequency is equal to a negative of the total frequency offset, and a mixer which multiplies the received signal with the tone to remove the total frequency offset from the received signal.

7. The receiver as claimed in claim 1, wherein the bootstrap processor is configured to divide the first bootstrap OFDM symbol in the frequency domain by the detected signature sequence to generate an estimate of the channel transfer function for use in equalising one or more of the other bootstrap OFDM symbols.

8. The receiver as claimed in claim 1, wherein the signature sequence includes a plurality of edge sub-carriers at either end of the signature sequence, which do not carry data, and the correlator is configured to perform the cross-correlation, which extends beyond the plurality of edge subcarriers.

9. The receiver as claimed in claim 1, wherein the up-sampler is configured to form the up-sampled frequency domain version of the first bootstrap OFDM symbol, by
identifying samples of the bootstrap symbol in the time domain using the synchronisation timing,
appending a plurality of zero valued samples to the samples of the first bootstrap OFDM symbol, and
performing a forward Fourier transform to convert the first bootstrap OFDM symbol with the appended zero valued samples into the frequency domain.

10. A method of detecting and recovering payload data from a received signal, the method comprising:
detecting the received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols,
detecting, from one or more of the bootstrap OFDM symbols, a synchronisation timing for converting a temporal length of a useful part of the bootstrap OFDM symbols into the frequency domain,
detecting which of a plurality of signature sequences was used in a first bootstrap OFDM symbol of the one or more bootstrap OFDM symbols and detecting, using the detected signature sequence, a frequency offset of the received signal and estimating a channel transfer function from the first bootstrap OFDM symbol, and
recovering signalling data from the one or more bootstrap OFDM symbols using the estimate of the channel transfer function determined, wherein
the detecting, using the signature sequence, a frequency offset of the received signal comprises
forming an up-sampled frequency domain version of the first bootstrap OFDM symbol, the up-sampled frequency domain version comprising for each sub-carrier of the first bootstrap OFDM symbol a plurality of samples representing each of the sub-carriers of the first bootstrap OFDM symbol,
cross-correlating a signature sequence of the plurality of signature sequences, which was combined with the first bootstrap OFDM symbol at the transmitter, with the up-sampled version of the first bootstrap OFDM symbol to generate for each of the sub-carriers of the up-sampled version of the OFDM symbol a correlation result,
identifying a peak correlation result, and
determining the frequency offset of the received signal from a relative position of the peak correlation result in the frequency domain in accordance with a sub-carrier bandwidth of the up-sampled version of the first bootstrap OFDM symbol.

11. The method as claimed in claim 10, wherein the frequency offset includes an integer frequency offset, IFO, representing a displacement in frequency of the received signal equivalent to an integer number of sub-carriers of the first bootstrap OFDM symbol, and the detecting, using the signature sequence, a frequency offset of the received signal comprises
determining the IFO by multiplying a bandwidth of the sub-carrier of the first bootstrap OFDM symbol with the relative position of the peak correlation result divided by an up-sampling factor.

12. The method as claimed in claim 10, wherein the frequency offset includes a Fine Frequency Offset, FFO, and the detecting, using the signature sequence, a frequency offset of the received signal includes
determining the FFO by subtracting from the frequency offset the IFO multiplied by the bandwidth of the sub-carrier of the first bootstrap OFDM symbol.

13. The method as claimed in claim 10, wherein the coefficients of the signature sequence are symmetrical around a central point of the signature sequence and the cross-correlating the signature sequence with the up-sampled version of the first bootstrap OFDM symbol to generate the correlation result comprises
generating the correlation result using half of the number of multiplications in proportion to a length of the signature sequence.

14. The method as claimed in claim 10, wherein the cross-correlating the signature sequence with the up-sampled version of the first bootstrap OFDM symbol to generate the correlation result samples comprises decimating the signature sequence to select one from every predetermined number of samples of the coefficients of the signature sequence to calculate the correlation result samples to reduce a number of multiplications and additions.

15. The method as claimed in claim 10, comprising
receiving a representation of the IFO and the FFO and to combine the IFO and the FFO to form a total frequency offset,
generating, from the total frequency offset, a tone whose frequency is equal to a negative of the total frequency offset, and
multiplying the received signal with the tone to remove the total frequency offset from the received signal.

16. The method as claimed in claim 10, comprising
dividing the first bootstrap OFDM symbol by the detected signature sequence in the frequency domain to generate an estimate of the channel transfer function for use in equalising one or more of the other bootstrap OFDM symbols.

17. The method as claimed in claim 10, wherein the forming the up-sampled frequency domain version of the bootstrap OFDM symbol, comprises
identifying samples of the first bootstrap symbol in the time domain using the synchronisation timing,
appending a plurality of zero valued samples to the samples of the first bootstrap OFDM symbol, and
performing a forward Fourier transform to convert the first bootstrap OFDM symbol with the appended zero valued samples into the frequency domain.

18. A receiver for detecting and recovering payload data from a received signal, the receiver comprising:
a radio frequency demodulation circuit configured to detect the received signal, the received signal having been formed and transmitted by a transmitter to carry the payload data as Orthogonal Frequency Division Multiplexed (OFDM) symbols in one or more of a plurality of time divided frames, each frame including a preamble including a plurality of bootstrap OFDM symbols;

a detector circuit configured to detect, from one or more of the bootstrap OFDM symbols, a synchronisation timing for converting a useful part of the bootstrap OFDM symbols into the frequency domain;

a bootstrap processor configured to detect, which of a plurality of signature sequences was used in a first bootstrap symbol of the one or more bootstrap symbols and using the detected signature sequence, to detect a frequency offset of the received signal and to estimate a channel transfer function from the first bootstrap OFDM symbol; and a demodulator circuit configured to recover signalling data from the one or more bootstrap OFDM symbols using the estimate of the channel transfer function;

wherein the bootstrap processor comprises:

an up-sampler configured to form an up-sampled frequency domain version of the first bootstrap OFDM symbol using the identified synchronisation timing;

a cross-correlator configured to cross-correlate each of a set of the signature sequences, with the up-sampled version of the first bootstrap OFDM symbol to generate for each of the set of the signature sequences a correlation result; and an output processor configured to identify a peak correlation result generated by the cross-correlator, and determine a signature sequence from the set of signature sequences to which the peak sample belongs to.

* * * * *